(12) United States Patent
Wang

(10) Patent No.: US 8,778,756 B2
(45) Date of Patent: Jul. 15, 2014

(54) SEMICONDUCTOR DEVICE AND METHOD OF MANUFACTURING THE SAME

(71) Applicant: Fujitsu Semiconductor Limited, Yokohama (JP)

(72) Inventor: Wensheng Wang, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/657,362

(22) Filed: Oct. 22, 2012

(65) Prior Publication Data

US 2013/0052753 A1 Feb. 28, 2013

Related U.S. Application Data

(62) Division of application No. 11/646,443, filed on Dec. 28, 2006, now Pat. No. 8,309,999.

(30) Foreign Application Priority Data

Aug. 29, 2006 (JP) .................................. 2006-231966

(51) Int. Cl.
*H01L 21/8242* (2006.01)
(52) U.S. Cl.
USPC ............................................. 438/253; 438/3
(58) Field of Classification Search
None
See application file for complete search history.

(56) References Cited

U.S. PATENT DOCUMENTS

| | | |
|---|---|---|
| 5,555,486 A | 9/1996 | Kingon et al. |
| 6,048,737 A | 4/2000 | Chung et al. |
| 6,169,305 B1 | 1/2001 | Takai et al. |
| 6,194,228 B1 | 2/2001 | Fujiki et al. |
| 6,376,090 B1 | 4/2002 | Kijima |
| 6,407,422 B1 | 6/2002 | Asano et al. |
| 6,495,412 B1 * | 12/2002 | Zhu et al. ...................... 438/240 |

(Continued)

FOREIGN PATENT DOCUMENTS

| | | |
|---|---|---|
| JP | 08-213560 A | 8/1996 |
| JP | 11-195768 A | 7/1999 |

(Continued)

OTHER PUBLICATIONS

Japanese Office Action dated Jun. 28, 2011, issued in corresponding Japanese Patent Application No. 2006-231966, with English Translation (4 pages).

(Continued)

*Primary Examiner* — Benjamin Sandvik
(74) *Attorney, Agent, or Firm* — Westerman, Hattori, Daniels & Adrian, LLP

(57) ABSTRACT

A method of manufacturing a semiconductor device comprising the steps of: forming a first interlayer insulating film over a substrate; forming a first conductive film over the first interlayer insulating film; forming a ferroelectric film on the first conductive film; forming a second conductive film on the ferroelectric film; forming an upper electrode of a capacitor by patterning the second conductive film; forming a capacitor dielectric film by patterning the ferroelectric film; and forming a lower electrode of the capacitor by patterning the first conductive film, wherein forming the first conductive film includes: forming a lower conductive layer made of a noble metal other than iridium over the first interlayer insulating film; and forming an upper conductive layer on the lower conductive layer, the upper conductive layer being made of a conductive material, which is different from a material for the lower conductive layer, and which is other than platinum.

9 Claims, 38 Drawing Sheets

(56) References Cited

U.S. PATENT DOCUMENTS

| | | |
|---|---|---|
| 6,509,601 B1 | 1/2003 | Lee et al. |
| 7,083,269 B2 | 8/2006 | Murai |
| 8,309,999 B2 | 11/2012 | Wang |
| 2002/0047147 A1 | 4/2002 | Kushida et al. |
| 2003/0047771 A1 | 3/2003 | Kweon et al. |
| 2003/0222299 A1 | 12/2003 | Miura |
| 2004/0113189 A1* | 6/2004 | Takamatsu et al. ........... 257/295 |
| 2004/0155278 A1 | 8/2004 | Natori et al. |
| 2005/0118795 A1 | 6/2005 | Hidaka et al. |
| 2005/0142733 A1 | 6/2005 | Kurihara et al. |
| 2005/0156216 A1 | 7/2005 | Cross et al. |
| 2005/0161726 A1 | 7/2005 | Shin et al. |
| 2006/0231880 A1 | 10/2006 | Yamakawa et al. |
| 2006/0262682 A1 | 11/2006 | Hattori et al. |

FOREIGN PATENT DOCUMENTS

| | | |
|---|---|---|
| JP | 2000-91539 A | 3/2000 |
| JP | 2000-164818 | 6/2000 |
| JP | 2002-190578 A | 7/2002 |
| JP | 2003-298136 A | 10/2003 |
| JP | 2004-95638 A | 3/2004 |
| JP | 2005-159165 A | 6/2005 |

OTHER PUBLICATIONS

US Office Action dated Oct. 21, 2013, issued in corresponding U.S. Appl. No. 13/657,325.

U.S. Notice of Allowance dated Feb. 10, 2014, issued in related U.S. Appl. No. 13/657,325.

* cited by examiner

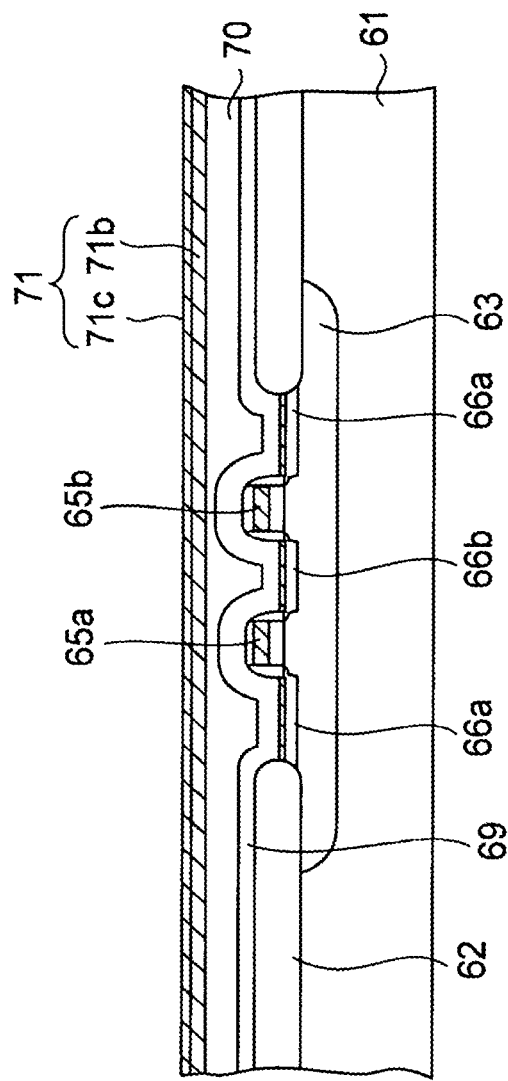
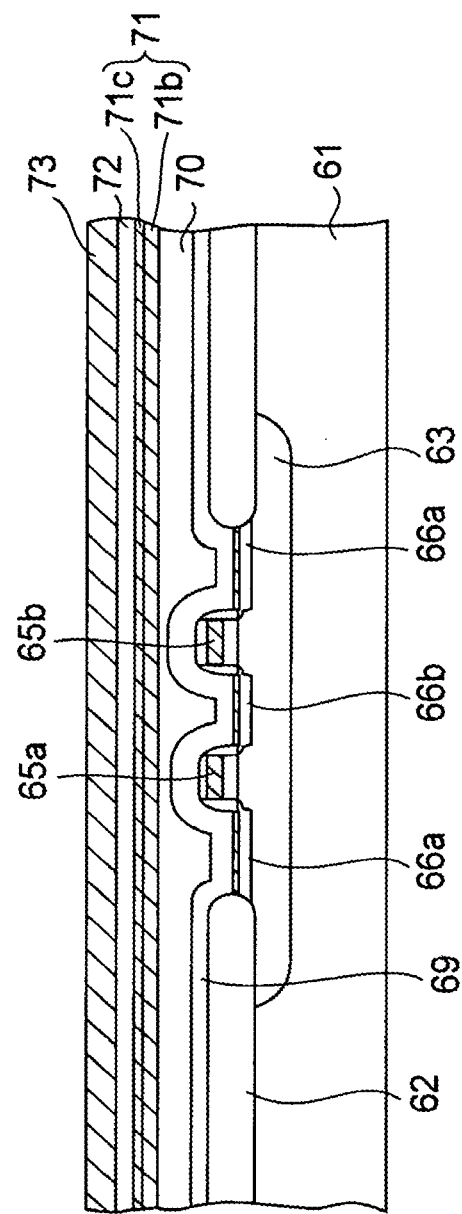
FIG. 7B
FIG. 7C

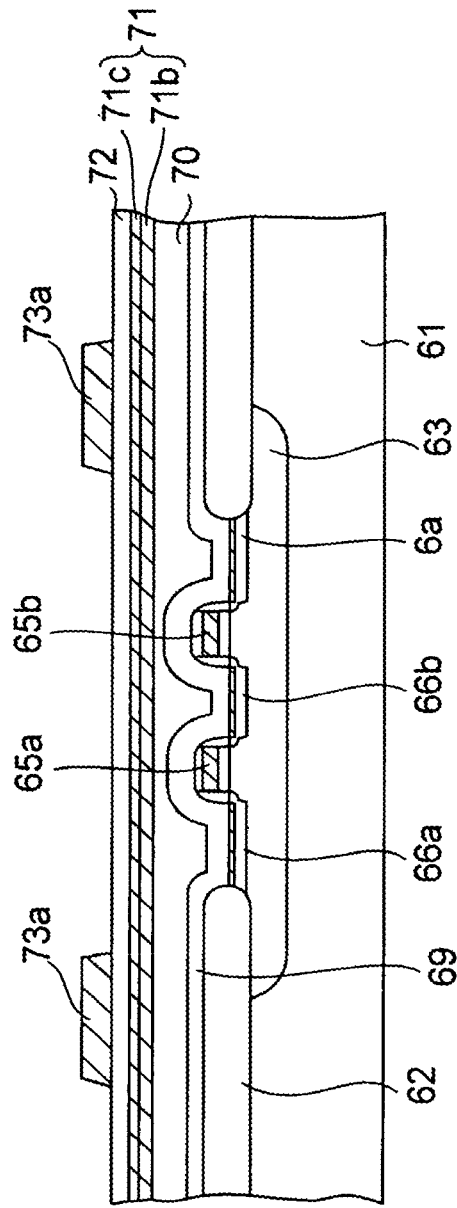
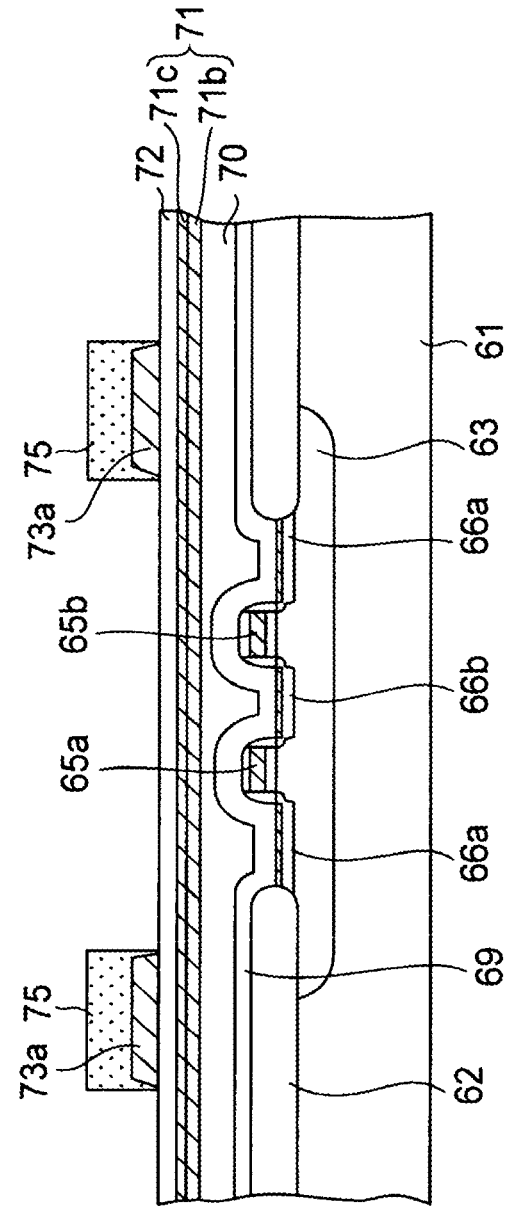
FIG. 7F
FIG. 7G

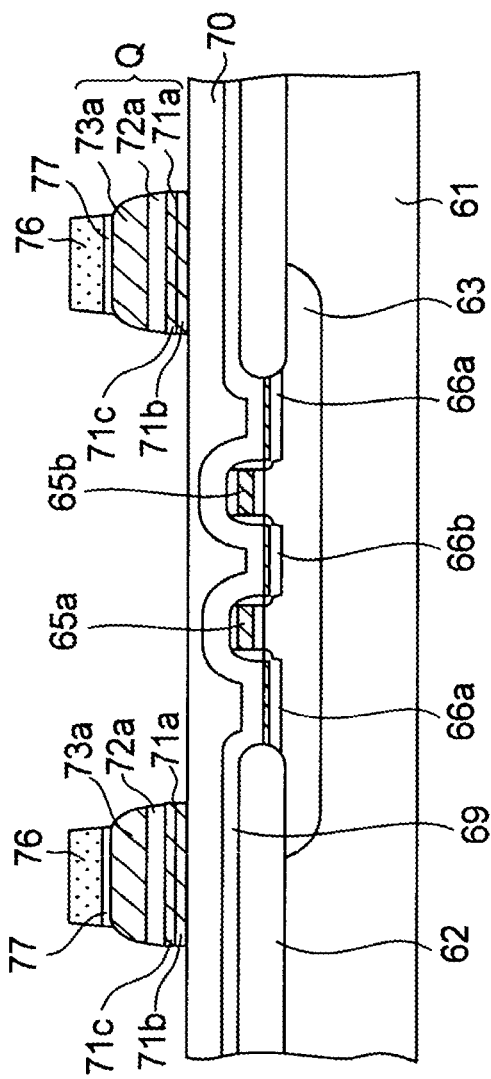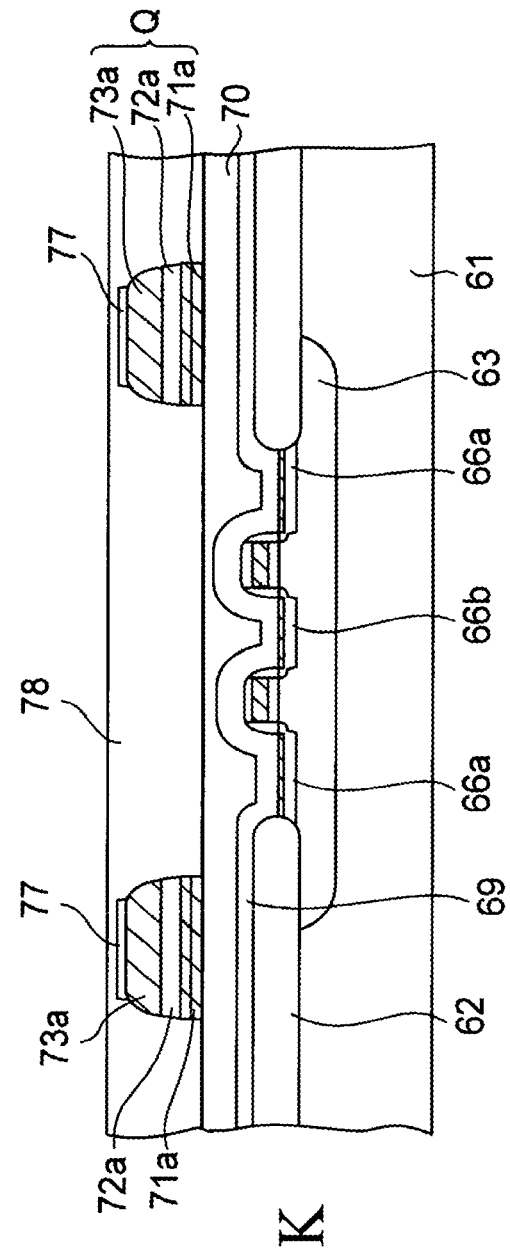

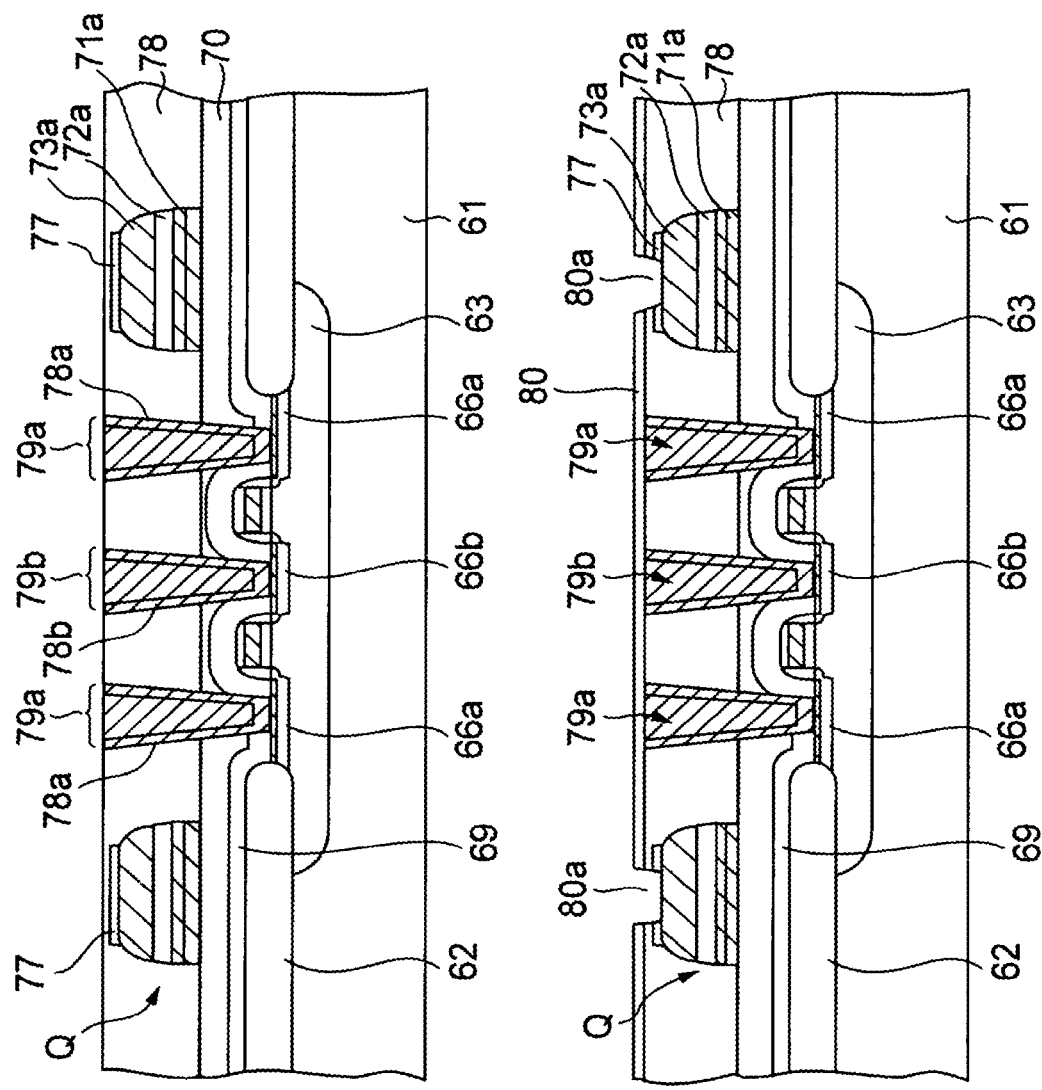

SEMICONDUCTOR DEVICE AND METHOD OF MANUFACTURING THE SAME

CROSS-REFERENCE TO RELATED APPLICATIONS

This application is a divisional of U.S. application Ser. No. 11/646,443 filed on Dec. 28, 2006, which is based on and claims priority of Japanese Patent Application No. 2006-231966 filed on Aug. 29, 2006, the entire contents of which are incorporated herein by reference.

BACKGROUND OF THE INVENTION

1. Field of the Invention

The present invention relates to a semiconductor device and a method of manufacturing the same.

2. Description of the Related Art

In recent years, with the evolution of digital technology, nonvolatile memories have been developed, in which a large volume of data can be stored fast.

As such nonvolatile memories, a flash memory and a ferroelectric memory are known.

Of these, the flash memory has a floating gate buried in a gate insulating film of an insulated-gate field-effect transistor (IGFET). The flash memory accumulates charge representing information to be stored, in this floating gate, thus storing the information. However, in such a flash memory, tunnel current needs to be passed through the gate insulating film when information is written or deleted. For this reason, such a flash memory has a disadvantage that relatively high voltage is required.

On the other hand, the ferroelectric memory is also called a ferroelectric random access memory (FeRAM), and stores information by utilizing hysteresis characteristics of a ferroelectric film provided in a ferroelectric capacitor. The ferroelectric film is polarized in response to a voltage applied between upper and lower electrodes of the capacitor, and a spontaneous polarization remains therein even when the voltage is removed. When the polarity of the applied voltage is reversed, this spontaneous polarization is also reversed. Information is written to the ferroelectric film with the orientation of the spontaneous polarization corresponding to "1" or "0." Voltage needed for this writing is lower than in flash memories. Moreover, the FeRAM has an advantage that faster writing can be performed than that in flash memories.

By utilizing this advantage, studies are being performed on applications of memory/logic mixed chips (SOC, system on chip), in which a logic circuit and an FeRAM are combined, to IC cards.

Different combinations of a lower electrode and the ferroelectric film, which constitute a ferroelectric capacitor, show different degrees of matching. Accordingly, ferroelectric characteristics of the ferroelectric capacitor greatly depend on the structure of the lower electrode.

For example, Japanese Unexamined Patent Application Publication No. 2005-159165 proposes that an $IrO_2$/Ir/TiAlN/TiN stack structure is employed as a lower electrode.

Moreover, Japanese Unexamined Patent Application Publication No. 2000-91539 proposes that an $IrO_2$ film, an Ir film, and a Pt film are formed in this order as a lower electrode.

Additionally, Japanese Unexamined Patent Application Publication No. 2004-95638 discloses that an Ir film and a Pt film are formed in this order as a lower electrode.

Furthermore, Japanese Unexamined Patent Application Publication No. 2000-164818 discloses that the fatigue resistance of PZT on a lower electrode is improved by forming a film stack including a Pt film and an Ir film as the lower electrode.

In addition, Japanese Unexamined Patent Application Publication No. 2003-298136 explains that it is preferable to employ a stack structure of Ir/Pt/Ir, Ir/Pt, Pt/Ir or the like as a lower electrode.

SUMMARY OF THE INVENTION

According to one aspect of the present invention, a semiconductor device is provided. The semiconductor device includes a first interlayer insulating film, a lower electrode, a capacitor dielectric film and an upper electrode. The first interlayer insulating film is formed over a semiconductor substrate. The lower electrode is formed over the first interlayer insulating film. The capacitor dielectric film is formed on the lower electrode, and is made of a ferroelectric material. The upper electrode is formed on the capacitor dielectric film. The lower electrode includes a lower conductive layer and an upper conductive layer. The lower conductive layer is made of a noble metal other than iridium. The upper conductive layer is formed on the lower conductive layer, and is made of a conductive material, which is different from a material for the lower conductive layer, and which is other than platinum.

In addition, according to another aspect of the present invention, a method of manufacturing a semiconductor device is provided. The method includes the steps of forming a first interlayer insulating film over a semiconductor substrate; forming a first conductive film over the first interlayer insulating film; forming a ferroelectric film on the first conductive film; forming a second conductive film on the ferroelectric film; forming an upper electrode of a capacitor by patterning the second conductive film; forming a capacitor dielectric film by patterning the ferroelectric film; and forming a lower electrode of the capacitor by patterning the first conductive film. The step of forming the first conductive film includes the steps of forming a lower conductive layer, made of a noble metal other than iridium, over the first interlayer insulating film; and forming an upper conductive layer on the lower conductive layer. The upper conductive layer is made of a conductive material, which is different from a material for the lower conductive layer, and which is other than platinum.

According to the present invention, the first conductive film, which becomes the lower electrode of the capacitor, is formed to have a two-layer structure including the lower and upper conductive layers.

Of these, the lower conductive layer is made of a noble metal other than iridium. On the other hand, the upper conductive layer is formed of a conductive material, which is different from the material for the lower conductive layer, and which is other than platinum. A reason for excluding platinum from the materials for the upper electrode is to prevent the capacitor dielectric film from deteriorating due to a reaction between the material constituting the capacitor dielectric film and platinum. Moreover, the use of expensive platinum for the upper conductive layer is not preferable also from the viewpoint of reducing the cost of a semiconductor device.

By giving such a two-layer structure to the first conductive film, the proportion of the material such as iridium for the upper conductive layer in the first conductive film is reduced compared with that in a case where the first conductive film is formed only of the material for the upper conductive layer. Accordingly, in the step of forming the lower electrode by patterning the first conductive film by etching, the amount of the material for the upper conductive layer, which is scattered as grains from the first conductive film, e.g., the number of iridium grains, is reduced. This reduces the number of grains of the material adhering again to side surfaces of the capacitor dielectric film. Accordingly, leakage paths are prevented from being formed by adhered iridium grains or the like. As a result, it becomes possible to provide a semiconductor device having low leakage current and improved electrical characteristics.

Furthermore, by forming the lower conductive layer thicker than the upper conductive layer in the step of forming the lower conductive layer, the proportion of the material constituting the upper conductive layer in the first conductive film is not more than half. Accordingly, the number of material grains, adhering to the side surfaces of the above-described capacitor dielectric film, is further reduced, and it becomes possible to more effectively reduce the leakage current of the capacitor.

Here, in the step of forming the lower conductive layer, it is preferable to form a platinum film as the lower conductive layer by sputtering at a substrate temperature of not less than 250° C. nor more than 450° C. Additionally, in the step of forming the upper conductive layer, it is preferable to form an iridium film as the upper conductive layer by sputtering at a substrate temperature of not less than 400° C. nor more than 550° C.

Forming the lower and upper conductive layers respectively in such temperature ranges reduces the stress of each layer simultaneously to prevent film delamination in these layers, and can also improve the crystallinity of each layer.

Furthermore, after the upper conductive layer is formed, the first conductive film may be annealed in an inert gas atmosphere. Such annealing improves the adhesion between the first conductive film and a film thereunder, and also improves the crystallinity of the first conductive film.

DESCRIPTION OF THE PREFERRED EMBODIMENTS

Next, embodiments of the present invention will be described in detail with reference to the accompanying drawings.

(1) Description of Research Results

Prior to embodiments of the present invention, a research conducted by the inventor of the present application will be described.

Figure 1:
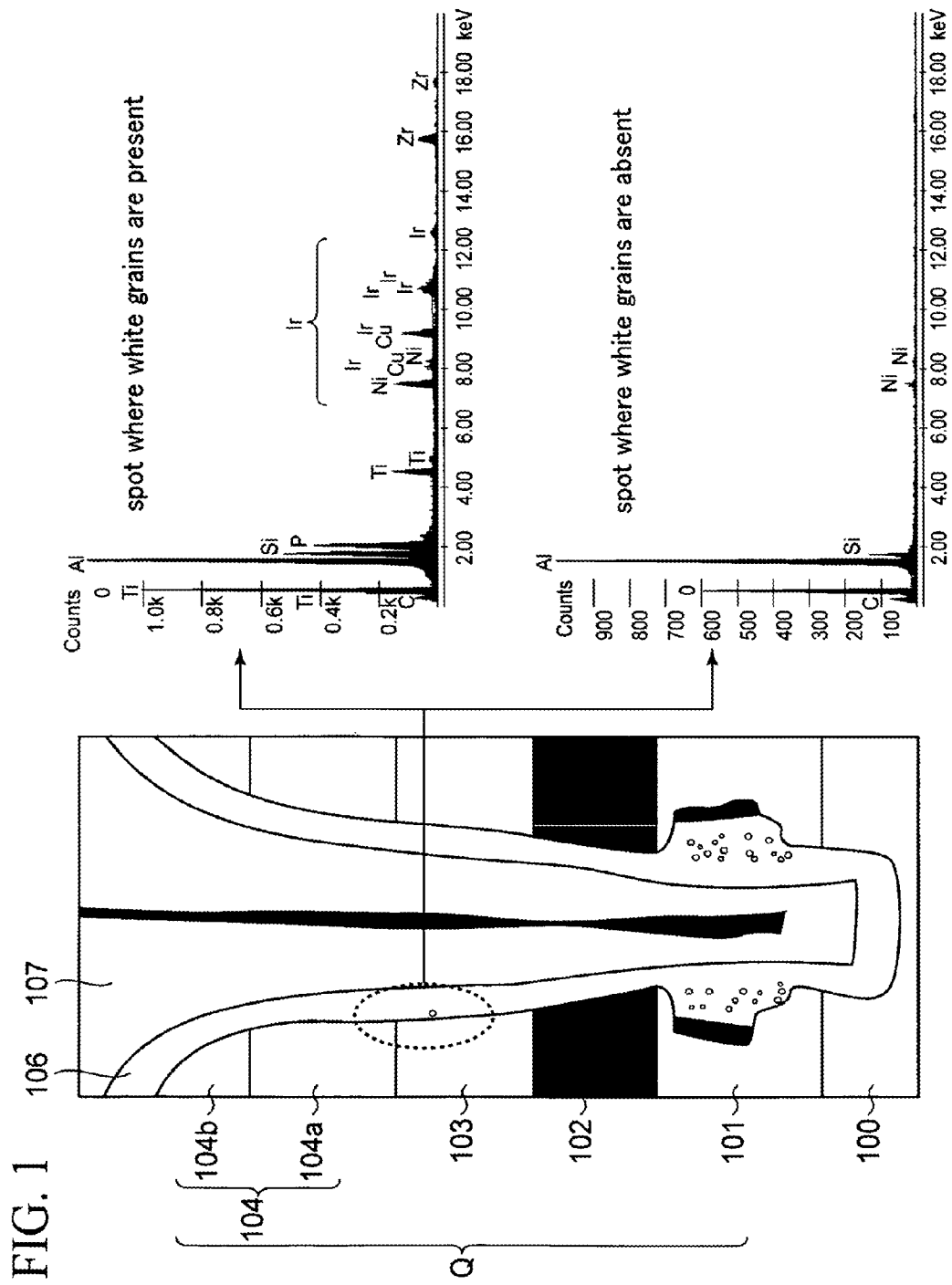
FIG. 1 shows a TEM cross-sectional image and EDX spectra (part 1) of a sample used in a research conducted by the inventor of the present application.

The drawing on the left side of FIG. 1 is a transmission electron microscope (TEM) cross-sectional image of a sample used in the research.

This sample is made by forming stacked capacitors Q on an underlying insulating film 100 made of a silicon oxide ($SiO_2$) film. In this drawing, side surfaces of the capacitors Q are enlarged. The capacitor Q includes a conductive oxygen barrier film 101 made of a titanium aluminum nitride (TiAlN) film, a lower electrode 102 made of an iridium film, and a capacitor dielectric film 103 made of PZT.

For an upper electrode 104 of this capacitor Q, a two-layer structure was employed, which included a conductive metal oxide film 104a made of an iridium oxide film, and a conductivity-improving film 104b made of an iridium film.

The conductive metal oxide film 104a made of iridium oxide has the function of blocking hydrogen from entering the capacitor Q from outside by the action of oxygen in the conductive metal oxide film 104a. Hydrogen can reduce and deteriorate the capacitor dielectric film 103.

The conductivity-improving film 104b has the function of reducing the contact resistance to a conductive plug (not shown) formed on the upper electrode 104.

Furthermore, this capacitor Q was covered with a capacitor protection insulating film 106 made of alumina which has an excellent ability to prevent the permeation of hydrogen. Moreover, an interlayer insulating film 107 made of silicon oxide was formed on the capacitor protection insulating film 106.

In this example, the lower electrode 102, the capacitor dielectric film 103, and the upper electrode 104 were formed by simultaneous etching. The capacitor Q formed by such simultaneous etching is also called a stacked capacitor, and is advantageous in improving packaging density because of its small occupying area.

It should be noted that methods of forming the capacitor Q which are employed in mass-production processes include, other than such simultaneous etching, a method in which the lower electrode 102, the capacitor dielectric film 103, and the upper electrode 104 are separately patterned to be formed in tiers (e.g., see FIGS. 2 to 12 of Japanese Unexamined Patent Application Publication No. 2003-298136). Such a tier capacitor is also called a planar capacitor.

Here, according to the research conducted by the inventor of the present application, in the stacked capacitor Q formed by simultaneous etching such as described above, the leakage current between the lower and upper electrodes 102 and 104 became approximately two to three orders of magnitude larger.

The inventor of the present application observed the above-described TEM image in detail in order to search for reasons for the increase in the leakage current of the capacitor Q. As a result, the inventor discovered that many white grains existed on a side surface of the capacitor dielectric film 103.

Then, these white grains were investigated with an energy dispersive X-ray fluorescence spectrometer (EDX), and the graph shown in the upper right of FIG. 1 was obtained.

As shown in this graph, many peaks indicating the existence of iridium appeared.

A position without white grains was investigated with the EDX for comparison purposes, and the graph shown in the lower right of FIG. 1 was obtained. It was found that iridium does not exist at the position without white grains.

From this result, it was confirmed that the white grains were iridium grains.

The iridium grains are considered to be those scattered from side surfaces of the lower electrode 102 made of an iridium film at the time of forming the capacitor Q by the simultaneous etching, in which the side surfaces of the lower electrode 102 are exposed to an etching atmosphere.

Since the iridium grains form leakage paths of the capacitor Q, the reduction of iridium grains is considered effective in reducing the leakage current.

It should be noted, however, that since iridium is difficult to be wet-etched compared with other platinum-group elements, iridium grains need to be removed without resort to wet etching.

Moreover, the inventor of the present application also investigated white grains adhering to a side surface of the conductive oxygen barrier film 101 of the above-described sample with the EDX.

Figure 2:
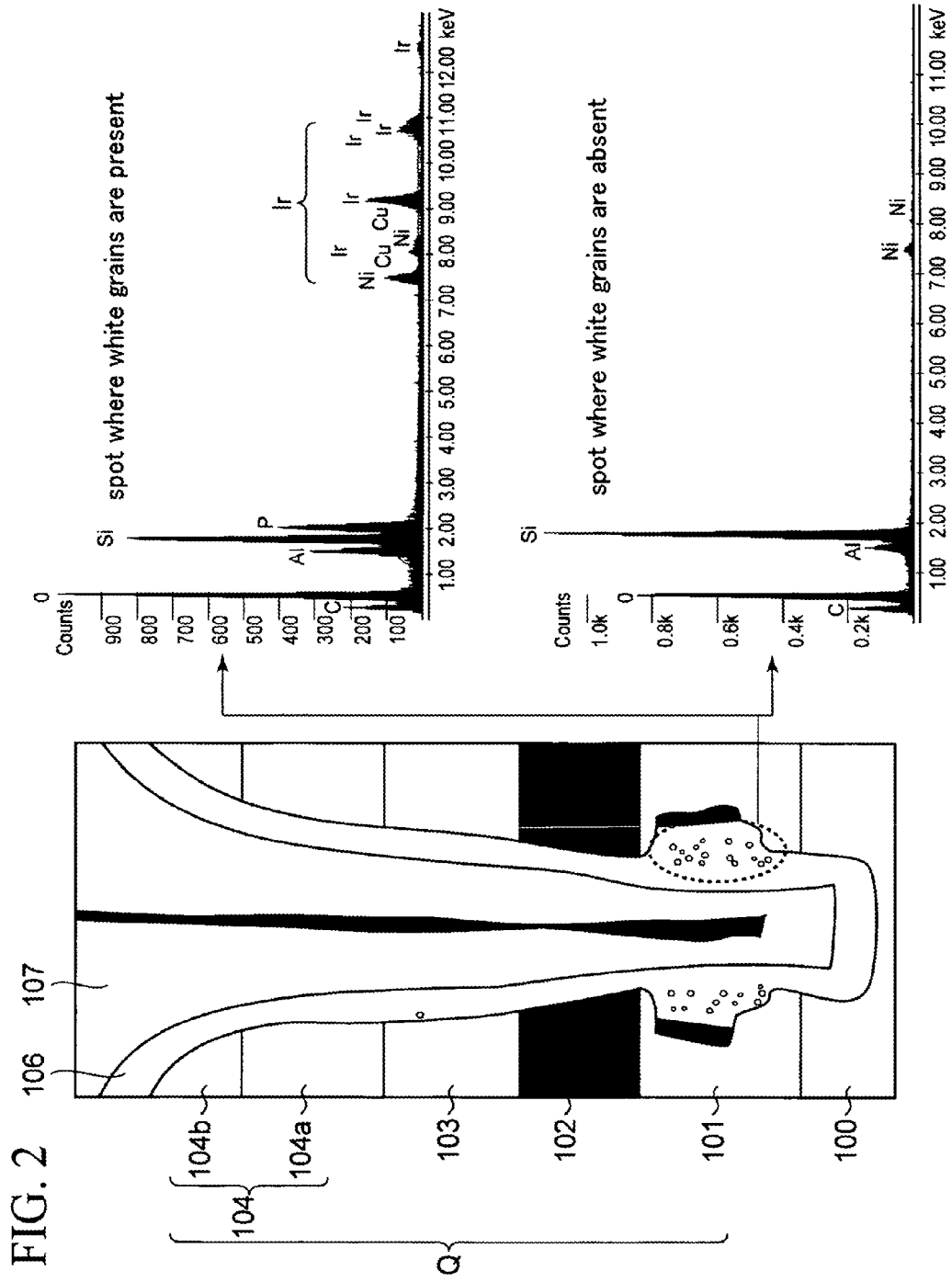
FIG. 2 shows a TEM cross-sectional image and EDX spectra (part 2) of the sample used in the research conducted by the inventor of the present application.

The result is shown in FIG. 2.

The graph in the upper right of FIG. 2 was obtained by investigating white grains near the side surface of the conductive oxygen barrier film 101 with the EDX. On the other hand, the graph in the lower right thereof was obtained by investigating a position without white grains.

As apparent from comparing these two graphs, iridium peaks appear at the position where the white grains are present in the graph, whereas the peaks do not appear at the position where the white grains are absent.

Based on the above-described research results, the inventor of the present application conceived the following embodiments of the present invention.

(2) First Embodiment

Figure 3A:
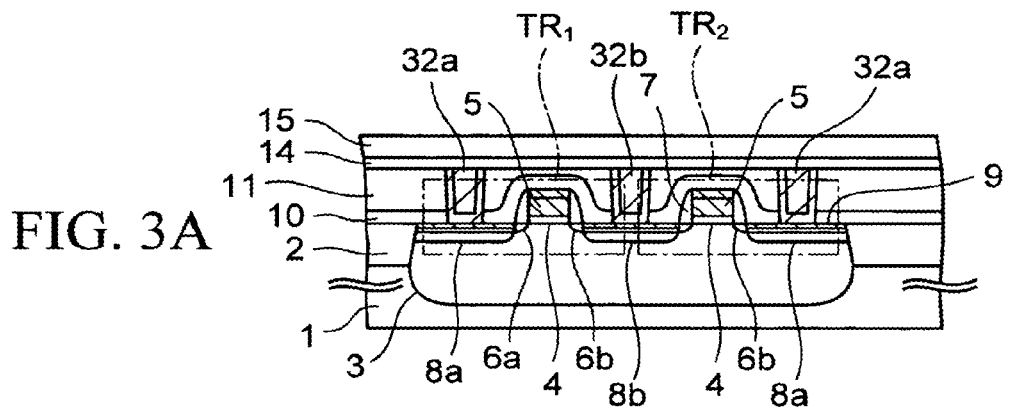
FIGS. 3A to 3W are cross-sectional views of a semiconductor device according to a first embodiment of the present invention in the process of being manufactured.
Figure 3B:
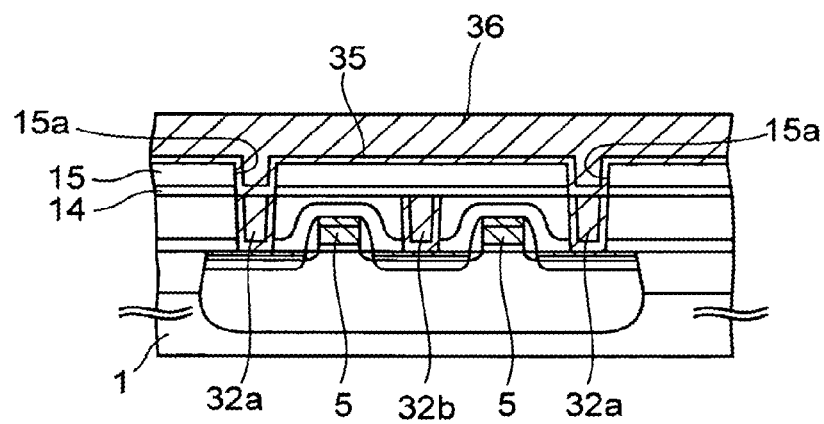
Figure 3C:
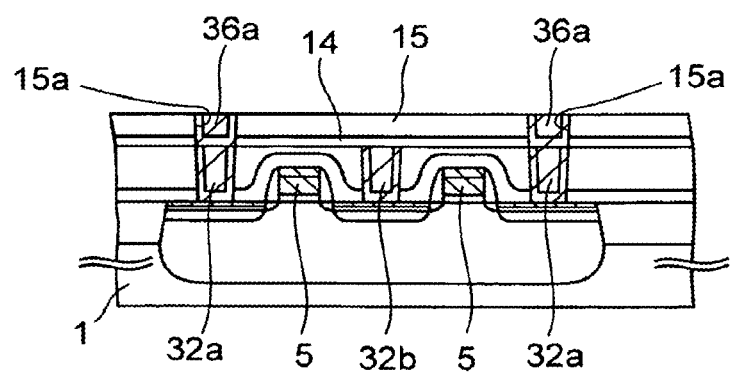
Figure 3D:
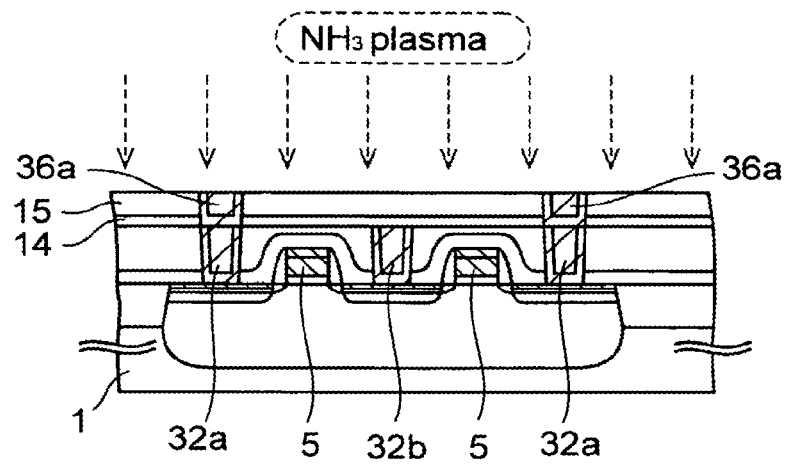
Figure 3E:
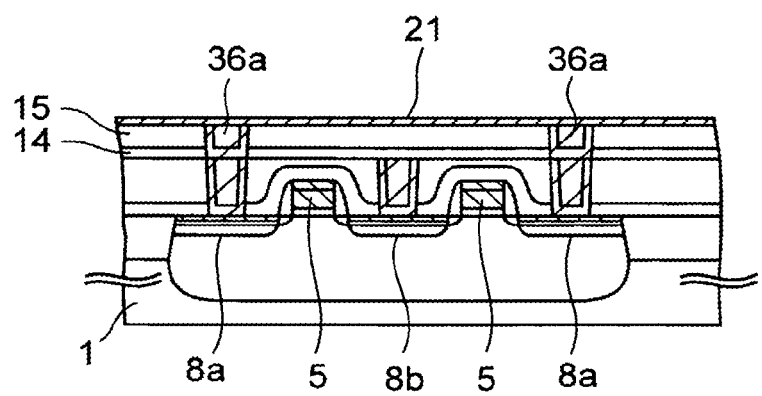
Figure 3F:
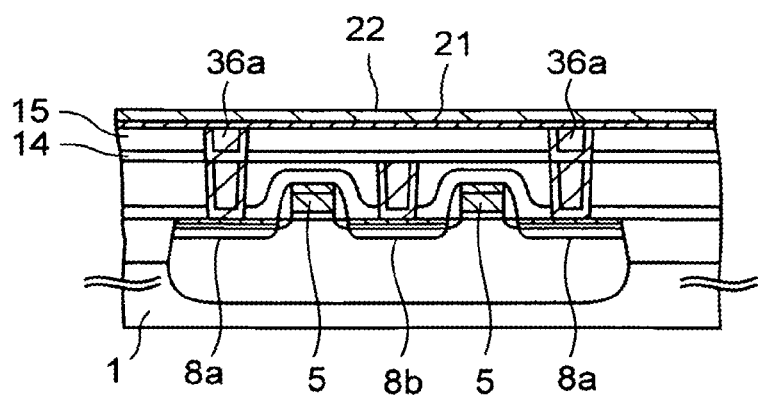
Figure 3G:
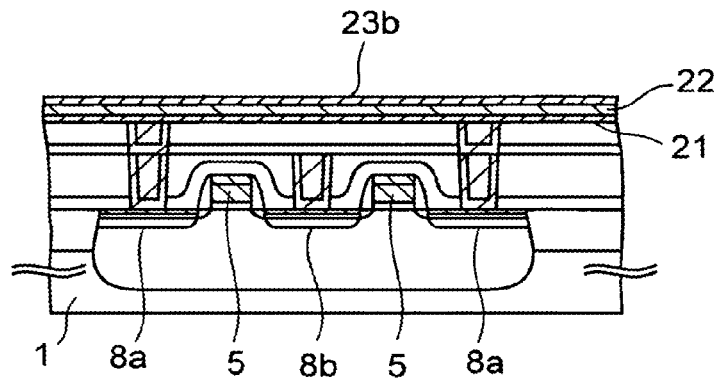
Figure 3H:
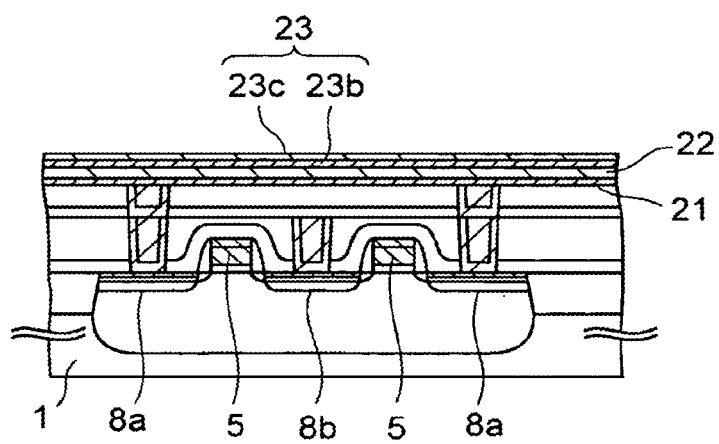
Figure 3I:
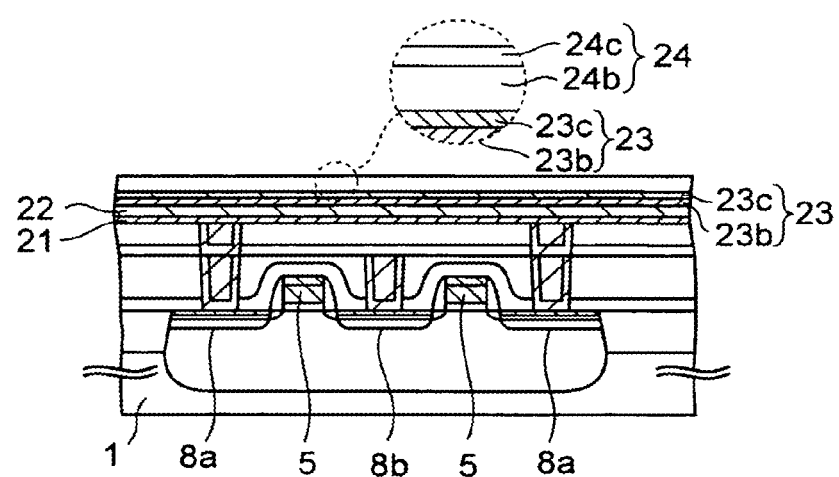
Figure 3J:
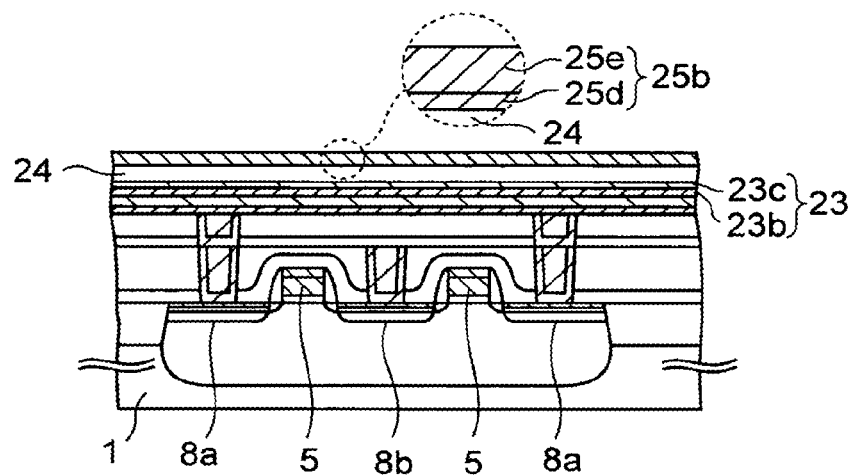
Figure 3K:
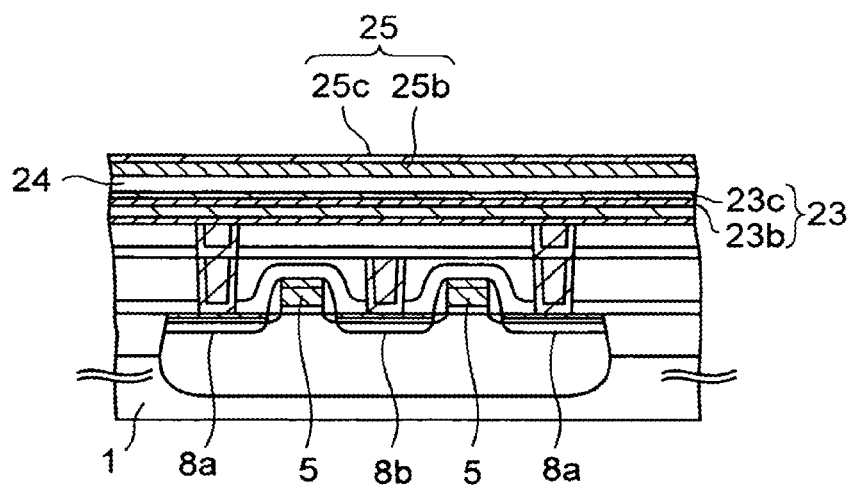
Figure 3L:
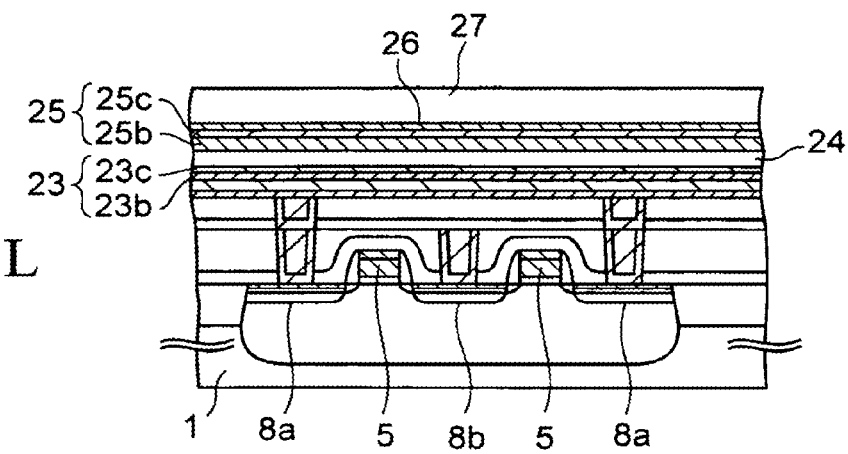
Figure 3M:
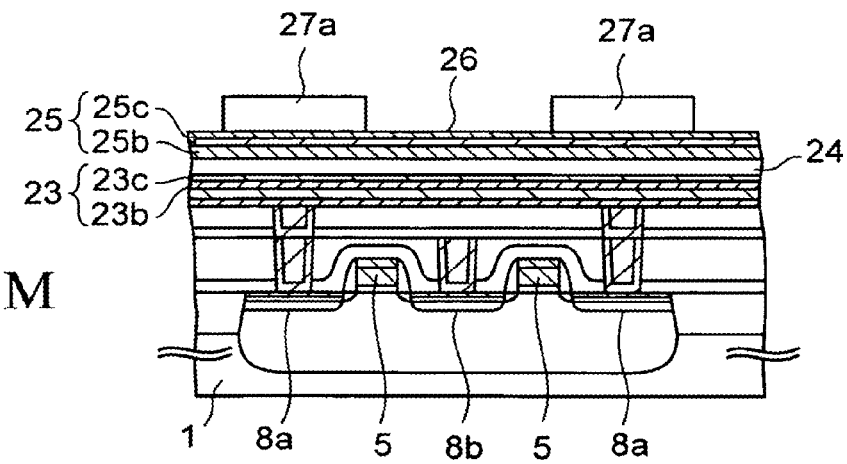
Figure 3N:
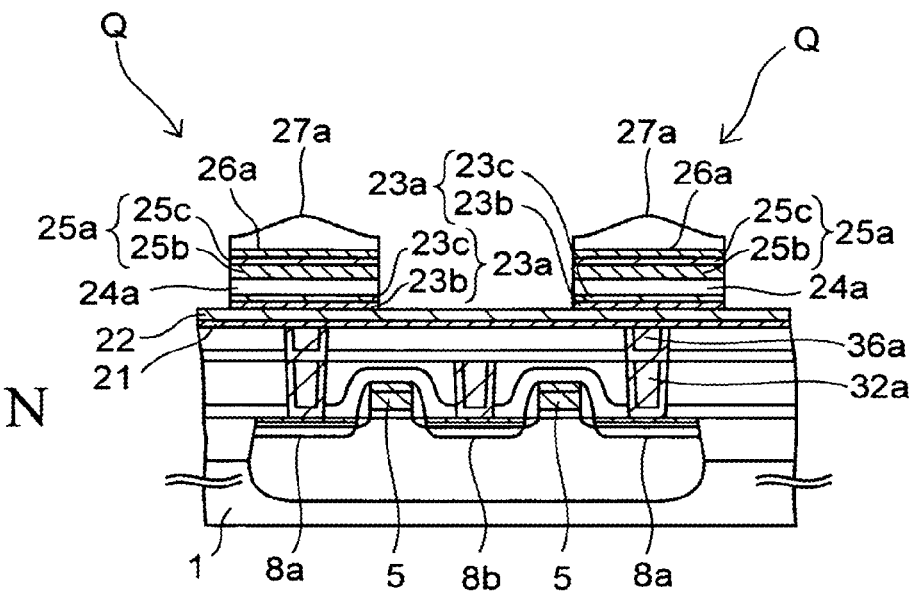
Figure 3O:
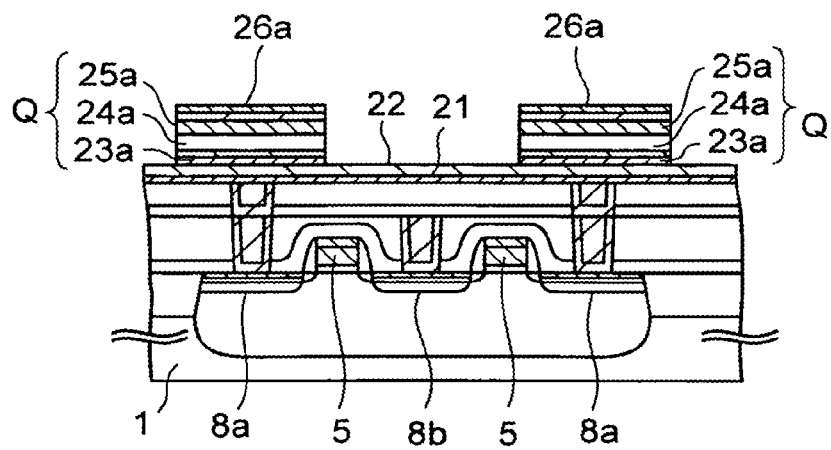
Figure 3P:
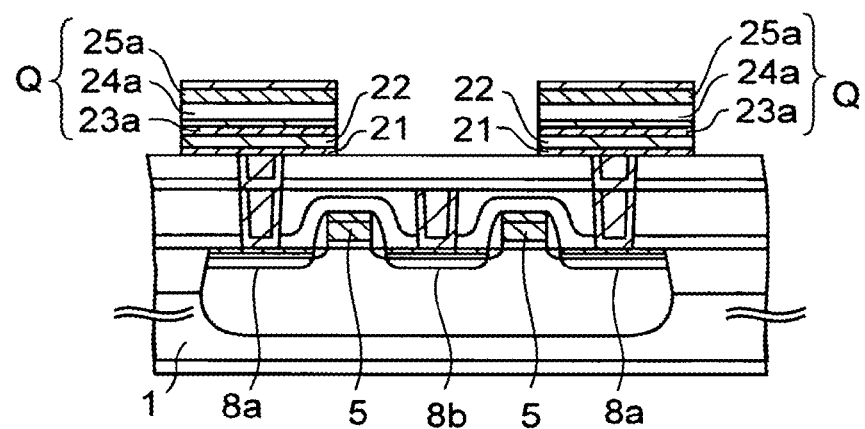
Figure 3Q:
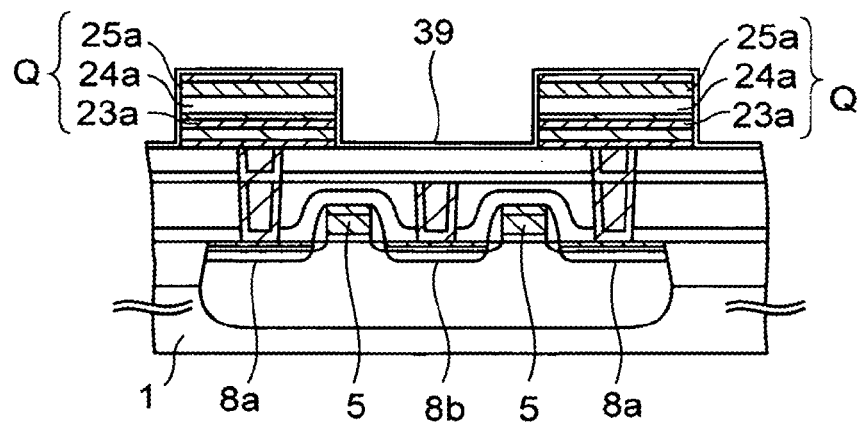
Figure 3R:
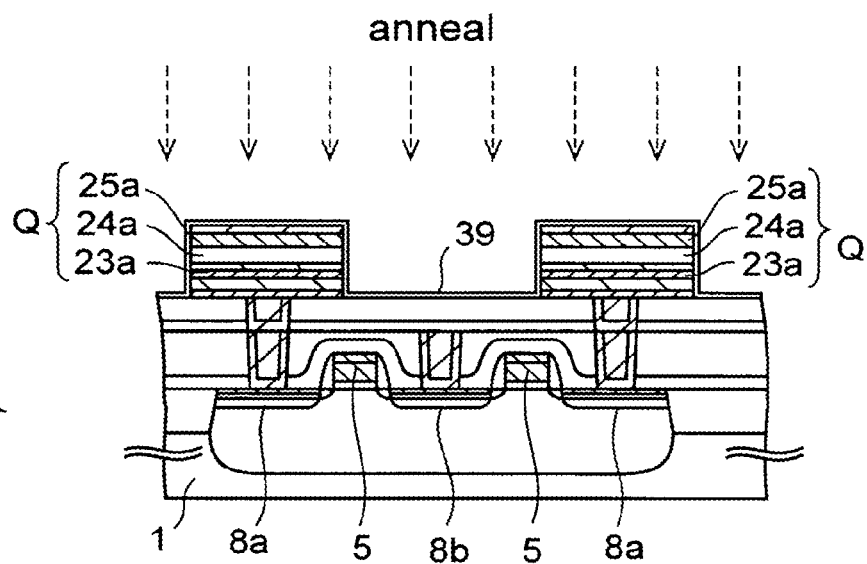
Figure 3S:
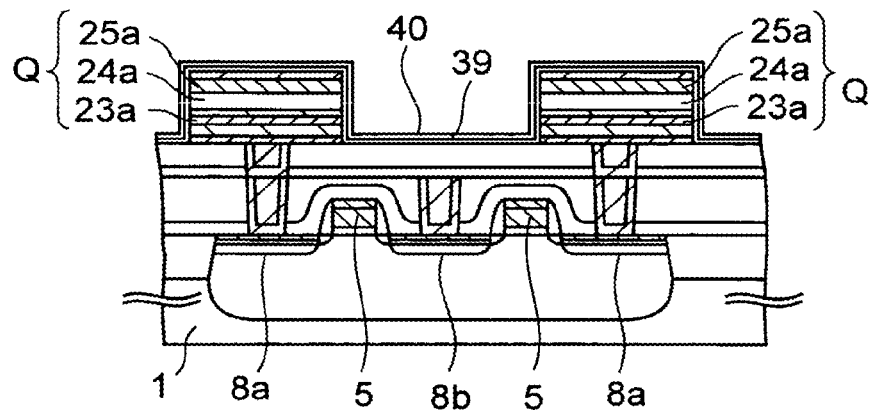
Figure 3T:
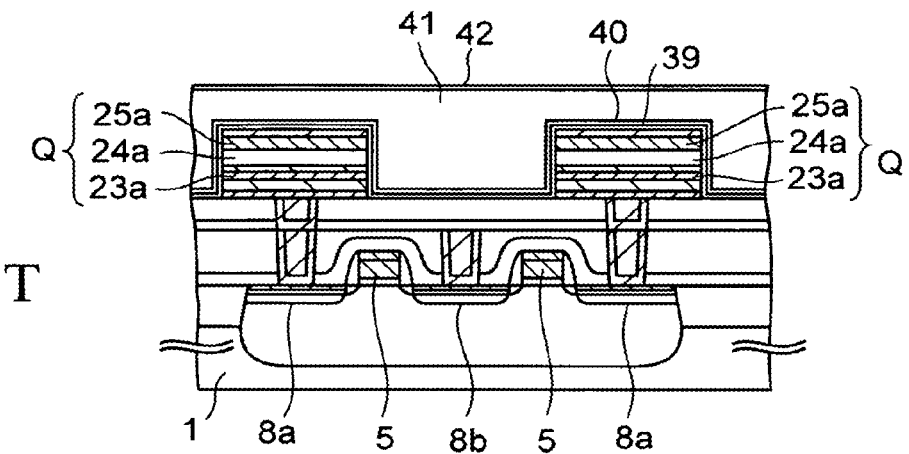
Figure 3U:
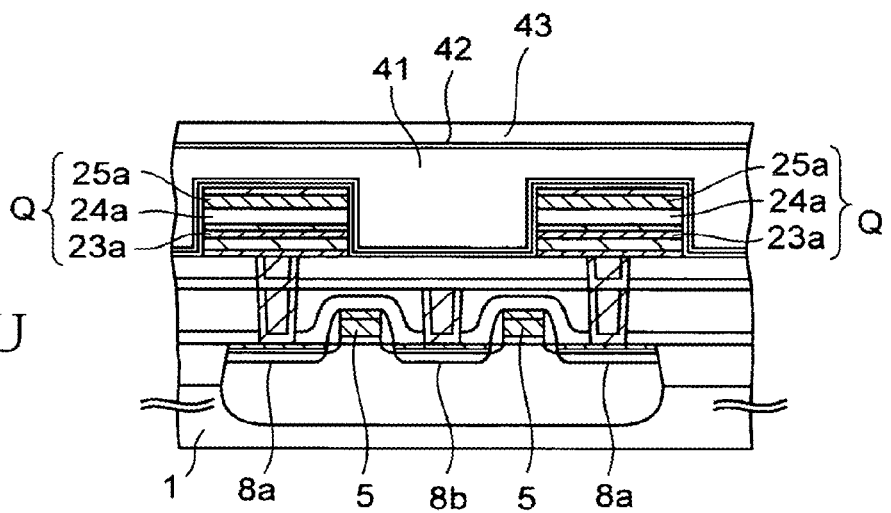
Figure 3V:
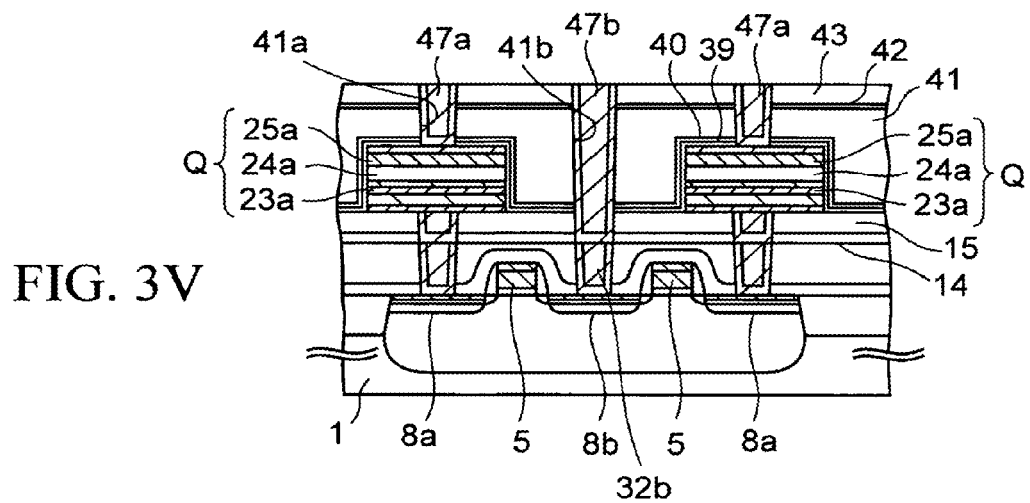
Figure 3W:
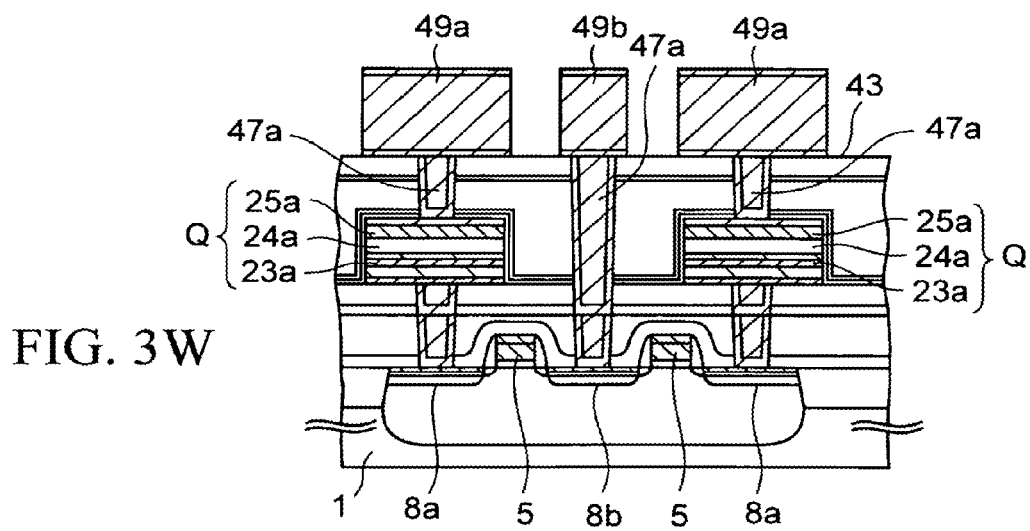

FIGS. 3A to 3W are cross-sectional views of a semiconductor device according to this embodiment in the process of being manufactured.

This semiconductor device is a stacked FeRAM advantageous in miniaturization, and is fabricated as follows.

At the beginning, steps for obtaining the cross-sectional structure shown in FIG. 3A will be described.

First, in a surface of an n- or p-type silicon (semiconductor) substrate 1, a trench for shallow trench isolation (STI) which delimits an active area for transistors is formed. The inside of the trench is then filled with an insulating film made of silicon oxide or the like. This insulating film is used as an element isolation insulating film 2. It should be noted that an element isolation structure is not limited to STI and that the element isolation insulating film 2 may be formed by local oxidation of silicon (LOCOS).

Next, a p-type impurity is introduced into the active area of the silicon substrate 1 to form a p-well 3. Then, the surface of the active area is thermally oxidized, and thereby a thermally oxidized film which becomes gate insulating films 4 is formed.

Subsequently, an amorphous or polycrystalline silicon film is formed over the entire upper surface of the silicon substrate 1. These films are patterned by photolithography, and thus two gate electrodes 5 are formed.

On the p-well 3, the above-described two gate electrodes 5 are arranged in parallel apart from each other. These gate electrodes 5 constitute portions of word lines.

Then, an n-type impurity is introduced into the silicon substrate 1 beside the gate electrodes 5 by ion implantation using the gate electrodes 5 as a mask, and thus first and second source/drain extensions 6a and 6b are formed.

Thereafter, an insulating film is formed over the entire upper surface of the silicon substrate 1. This insulating film is etched back, and thus insulating sidewalls 7 are formed on side surfaces of the gate electrodes 5. As the insulating film, for example, a silicon oxide film is formed by CVD.

Subsequently, ions of an n-type impurity are again implanted into the silicon substrate 1 using the insulating sidewalls 7 and the gate electrodes 5 as a mask, whereby first and second source/drain regions (first and second impurity diffusion regions) 8a and 8b apart from each other are formed in the surface layer of the silicon substrate 1 beside the two gate electrodes 5.

By the steps described so far, first and second MOS transistors $TR_1$ and $TR_2$ including the gate insulating films 4, the gate electrodes 5, and the first and second source/drain regions 8a and 8b are formed in the active area of the silicon substrate 1.

Next, a refractory metal layer such as a cobalt layer is formed over the entire upper surface of the silicon substrate 1 by sputtering. Then, this refractory metal layer is heated to be reacted with silicon, and thus a refractory metal silicide layer 9 is formed on the silicon substrate 1. The refractory metal silicide layer 9 is also formed in surface layer portions of the gate electrodes 5, whereby the resistances of the gate electrodes 5 are reduced.

Thereafter, unreacted portions of the refractory metal layer on the element isolation insulating film 2 and the like are removed by wet etching.

Subsequently, a silicon nitride (SiN) film is formed over the entire upper surface of the silicon substrate 1 to a thickness of approximately 200 nm by plasma CVD. The silicon nitride film is used as a cover insulating film 10. Then, a silicon oxide film is formed as a first interlayer insulating film 11 on this cover insulating film 10 to a thickness of approximately 1000 nm by plasma CVD using TEOS gas.

Next, the upper surface of the first interlayer insulating film 11 is polished and planarized by chemical mechanical polishing (CMP). As a result of this CMP, the thickness of the first interlayer insulating film 11 becomes approximately 700 nm on the flat surface of the silicon substrate 1.

Subsequently, the cover insulating film 10 and the first interlayer insulating film 11 are patterned by photolithography, and thus contact holes each having a diameter of 0.25 μm are formed over the first and second source/drain regions 8a and 8b. Furthermore, a glue film (adhesion film) and a tungsten film are formed in this order in these contact holes. Then, unnecessary portions of the glue film and the tungsten film on the first interlayer insulating film 11 are polished and removed by CMP in a way that these films are left only in the contact holes as first and second conductive plugs 32a and 32b.

These first and second conductive plugs 32a and 32b are electrically connected respectively to the first and second source/drain regions 8a and 8b.

It should be noted that the above-described glue film is made by forming a titanium film having a thickness of approximately 30 nm and a titanium nitride film having a thickness of approximately 20 nm in this order. Moreover, the tungsten film before applying the CMP thereto has a thickness of approximately 300 nm on the first interlayer insulating film 11.

Here, the first and second conductive plugs 32a and 32b consist primarily of tungsten, which is prone to oxidation. The oxidation of the first and second conductive plugs 32a and 32b during the process may cause a contact failure.

Accordingly, as an anti-oxidation insulating film 14 for preventing the oxidation of the conductive plugs 32a and 32b, a silicon oxynitride (SiON) film is formed on these plugs 32a and 32b and the first interlayer insulating film 11 to a thickness of approximately 200 nm by plasma CVD.

It should be noted that instead of the silicon oxynitride film, a silicon nitride (SiN) film or an alumina film may be formed as the anti-oxidation insulating film 14.

Thereafter, a silicon oxide film is formed on the anti-oxidation insulating film 14 to a thickness of approximately 300 nm by plasma CVD using TEOS gas. This silicon oxide film is used as an underlying insulating film 15.

Next, steps for obtaining the cross-sectional structure shown in FIG. 3B will be described.

First, the underlying insulating film 15 and the anti-oxidation insulating film 14 are patterned, and thereby first holes 15a are formed in these insulating films respectively over the first conductive plugs 32a.

Subsequently, a titanium nitride film is formed as a glue film 35 on the inner surfaces of these first holes 15a and on the underlying insulating film 15 by sputtering.

Furthermore, a tungsten film is formed as a plug conductive film 36 on this glue film 35 by CVD, whereby the first holes 15a are fully filled with this plug conductive film 36.

Then, as shown in FIG. 3C, unnecessary portions of the glue film 35 and the plug conductive film 36 on the underlying insulating film 15 are polished and removed by CMP. Accordingly, the glue film 35 and the plug conductive film 36 are left in the first holes 15a as third conductive plugs 36a electrically connected to the first conductive plugs 32a.

In this CMP, used is such slurry that the polishing speeds of the glue film 35 and the plug conductive film 36 to be polished become faster than that of the underlying insulating film 15, e.g., W2000 manufactured by Cabot Microelectronics Corporation. Moreover, in order to prevent unpolished portions from being left on the underlying insulating film 15, the polishing amount of this CMP is set larger than the total thickness of the films 35 and 36. Thus, this CMP is over polishing.

Next, as shown in FIG. 3D, the underlying insulating film 15 made of silicon oxide is exposed to a nitrogen-containing plasma, e.g., an ammonia ($NH_3$) plasma. Accordingly, NH groups are bonded to oxygen atoms on the surface of the underlying insulating film 15.

In this ammonia plasma treatment, for example, a parallel-plate plasma treatment system is used which has a counter electrode at a distance of approximately 9 mm (350 mils) from the silicon substrate 1. While the substrate temperature is being maintained at 400° C. at a pressure of 266 Pa (2 Torr), ammonia gas is supplied to the inside of a chamber at a flow rate of 350 sccm. The treatment is performed by supplying a high-frequency power of 100 W at 13.56 MHz to the silicon substrate 1 and a high-frequency power of 55 W at 350 kHz to the above-described counter electrode for 60 seconds.

Subsequently, as shown in FIG. 3E, a titanium film is formed on the underlying insulating film 15 and the third conductive plugs 36a to a thickness of approximately 20 nm. This titanium film is used as a crystalline conductive film 21.

Deposition conditions for this crystalline conductive film 21 are not particularly limited. In this embodiment, a sputtering chamber is used, in which the distance between the silicon substrate 1 and a titanium target is set at 60 mm, and the substrate temperature is set at 20° C. in an argon atmosphere at 0.15 Pa. The crystalline conductive film 21 made of titanium is formed by supplying a DC power of 2.6 kW to the chamber for five seconds.

Here, ammonia plasma treatment (see FIG. 3D) has been performed in advance, and NH groups have been bonded to oxygen atoms on the surface of the underlying insulating film 15. Accordingly, titanium atoms deposited on the underlying insulating film 15 are less prone to be captured by oxygen atoms on the surface of the underlying insulating film 15. For this reason, the titanium atoms can freely move on the surface of the underlying insulating film 15, and it becomes possible to form the crystalline conductive film 21 made of titanium which is strongly self-assembled in the (002) direction.

It should be noted that a material for the crystalline conductive film 21 is not limited to titanium. The crystalline conductive film 21 may be made of any one of titanium, platinum, iridium, rhenium, ruthenium, palladium, and osmium, or an alloy of any thereof.

Thereafter, rapid thermal anneal (RTA) in which the substrate temperature and the treatment time are respectively set at 650° C. and 60 seconds, is performed on the crystalline conductive film 21 in an nitrogen atmosphere. Accordingly, the crystalline conductive film 21 made of titanium is nitrided, and the crystalline conductive film 21 is made of titanium nitride oriented in the (111) direction.

Next, as shown in FIG. 3F, a titanium aluminum nitride (TiAlN) film is formed as a conductive oxygen barrier film 22 on this crystalline conductive film 21 to a thickness of 100 nm by reactive sputtering.

The conductive oxygen barrier film 22 made of titanium aluminum nitride is excellent in the function of preventing oxygen permeation, and has a role of preventing the third conductive plugs 36a thereunder from being oxidized and causing a contact failure.

Deposition conditions for this conductive oxygen barrier film 22 are not particularly limited. In this embodiment, a target made of an alloy of titanium and aluminum is used, and a gas mixture of argon gas and nitrogen gas is used as sputtering gas. The flow rates of the argon gas and the nitrogen gas are set respectively at 40 sccm and 100 sccm, and the conductive oxygen barrier film 22 is formed at a pressure of 253.3 Pa, a substrate temperature of 400° C., and a sputtering power of 1.0 kW.

Moreover, the conductive oxygen barrier film 22 is not limited to a titanium aluminum nitride film. As the conductive oxygen barrier film 22, an iridium film or a ruthenium film can also be formed.

Next, as shown in FIG. 3G, a platinum film is formed as a lower conductive layer 23b of a first conductive film on the conductive oxygen barrier film 22 to a thickness of approximately 60 nm by sputtering. The platinum film is formed, for example, in an argon atmosphere at a pressure of 0.2 Pa by setting the substrate temperature at 400° C. and the sputtering power at 0.5 kW.

It should be noted that a material for this lower conductive layer 23b is not particularly limited as long as it is a noble metal other than iridium. The lower conductive layer 23b may be formed of rhodium or palladium.

Subsequently, as shown in FIG. 3H, an iridium film is formed on the lower conductive layer 23b to a thickness of 40 nm. This iridium film is used as an upper conductive layer 23c of the first conductive film. Deposition conditions for this iridium film are not particularly limited. In this embodiment, the following conditions are employed: an argon atmosphere at a pressure of 0.11 Pa, a substrate temperature of 500° C. and a sputtering power of 0.3 kW.

Furthermore, a conductive material constituting the upper conductive layer 23c is not limited to iridium, and may be any one of ruthenium, iridium oxide, ruthenium oxide, and $SrRuO_3$.

Accordingly, the first conductive film 23 including the lower and upper conductive layers 23b and 23c is formed.

The crystallinity of the first conductive film 23 greatly affects the orientation of a ferroelectric film to be formed thereon later. Accordingly, respective deposition temperatures for the lower and upper conductive layers 23b and 23c are preferably set as high as possible to improve the crystallinity of the first conductive film 23, and to thus improve the orientation of the ferroelectric film.

It should be noted, however, that if the deposition temperatures are too high, the stress of each of the lower and upper conductive layers 23b and 23c becomes high, and film delamination may occur in the layers 23b and 23c.

Accordingly, as a substrate temperature for depositing each of the layers 23b and 23c, a temperature is preferably employed which is as high as possible and at which stress becomes small.

In a case where a platinum film is formed as the lower conductive layer 23b, a temperature range in which the stress of the lower conductive layer 23b becomes small is 280° C. to 300° C. Accordingly, the lower conductive layer 23b is preferably formed at a substrate temperature of not less than 250° C. nor more than 450° C., which includes the above-described temperature range, in which the upper limit is shifted higher.

On the other hand, in a case where an iridium film is formed as the upper conductive layer 23c, a temperature range in which the stress of the upper conductive layer 23c becomes small is 420° C. to 450° C. Accordingly, the upper conductive layer 23c is preferably formed at a substrate temperature of not less than 400° C. nor more than 550° C., which includes the above-described temperature range, in which the upper limit is shifted higher.

Employing such temperature ranges makes it possible to improve the crystallinity of the first conductive film 23 while preventing film delamination in the layers 23b and 23c.

Here, as described previously, the titanium nitride film constituting the crystalline conductive film 21 is oriented in the (111) direction. Accordingly, the crystallinity of the first conductive film 23 becomes more favorable also by the action of this orientation.

Thereafter, in an argon atmosphere, RTA in which the substrate temperature is set at a temperature of not less than 650° C. is performed on the first conductive film 23 for 60 seconds. As a result, the adhesion between the films 21 to 23 is enhanced, and also the crystallinity of the first conductive film 23 is improved.

The atmosphere for this RTA is not particularly limited as long as it is an inert gas atmosphere. Such inert gases include nitrogen gas and $N_2O$ gas other than argon gas.

Subsequently, as shown in FIG. 3I, a lead zirconate titanate (PZT, $PbZrTiO_3$) film having a perovskite structure is formed on the first conductive film 23 by MOCVD. This PZT film is used as a first ferroelectric film 24b. The first ferroelectric film 24b formed by MOCVD has already been crystallized at the time of deposition. Accordingly, crystallization annealing for crystallizing the first ferroelectric film 24b is unnecessary.

The MOCVD is performed as follows.

First, each of $Pb(DPM)_2$ (chemical formula is $Pb(C_{11}H_{19}O_2)_2$), $Zr(dmhd)_4$ (chemical formula is $Zr(C_9H_{15}O_2)_4$), and $Ti(O-iOr)_2(DPM)_2$ (chemical formula is $Ti(C_3H_7O)_2(C_{11}H_{19}O_2)_2$) is dissolved in a tetra hydro furan (THF, $C_4H_8O$) solvent at a concentration of 0.3 mol/l, and thus respective liquid raw materials of Pb, Zr and Ti are prepared. Then, these liquid raw materials are supplied to a vaporizer of an MOCVD system respectively at flow rates of 0.326 ml/min, 0.200 ml/min, and 0.200 ml/min to be vaporized, and thus a raw material gas containing Pb, Zr and Ti is obtained. It should be noted that to the above-described vaporizer, a THF solvent is also supplied at a flow rate of 0.474 ml/min together with the liquid raw materials.

Furthermore, while the above-described raw material gas is being supplied to the chamber, the pressure in the chamber is set at 665 Pa (5 Torr) and the substrate temperature is maintained at 620° C. By maintaining such a state for 620 seconds, the above-described PZT film is formed to a thickness of 100 nm.

It should be noted that the first ferroelectric film 24b is not limited to a PZT film. The first ferroelectric film 24b may be made of a material obtained by doping PZT with at least one of lanthanum, calcium, strontium, and silicon. Each of these materials has a perovskite structure. Accordingly, when the upper conductive layer 23c under the first ferroelectric film 24b is made of $SrRuO_3$ having a perovskite structure, the lattice matching between the upper conductive layer 23c and the first ferroelectric film 24b becomes favorable, and the crystallinity of the first ferroelectric film 24b is enhanced.

It should be noted that the first ferroelectric film 24b may be formed of a Bi layered compound such as $(Bi_{1-x}R_x)Ti_3O_{12}$ (R is a rare-earth element, and $0<x<1$), $SrBi_2Ta_2O_9$, or $SrBi_4Ti_4O_{15}$.

Moreover, the first ferroelectric film 24b may be formed of a high-dielectric metal oxide material containing zirconium or lead, instead of a ferroelectric material.

Here, as described previously, the crystallinity of the first conductive film 23 is favorable by the action of the crystalline conductive film 21 made of titanium nitride oriented in the (111) direction. Accordingly, the crystallinity of the first ferroelectric film 24b formed on the first conductive film 23 also becomes favorable. Accordingly, ferroelectric characteristics, e.g., the remanent polarization charge amount, of the first ferroelectric film 24b are improved.

Next, a PZT film is formed as a second ferroelectric film 24c on the first ferroelectric film 24b to a thickness of 1 to 30 nm, e.g., to a thickness of 20 nm, by sputtering. These first and second ferroelectric films 24b and 24c are used as a ferroelectric film 24.

It should be noted that unlike the first ferroelectric film 24b formed by MOCVD, the second ferroelectric film 24c formed by sputtering is not crystallized but in an amorphous state, at the time of deposition.

Moreover, the second ferroelectric film 24c is not limited to PZT.

The second ferroelectric film 24c may be made of a ferroelectric material having an $ABO_3$ perovskite structure (A=any one of Bi, Pb, Ba, Sr, Ca, Na, K and rare-earth elements; B=any one of Ti, Zr, Nb, Ta, W, Mn, Fe, Co and Cr) similarly to PZT.

Furthermore, the second ferroelectric film 24c may be made of a material obtained by doping PZT with at least one of lanthanum, calcium, strontium, and silicon. Doping a PZT film with these elements improves the fatigue loss and imprint characteristics of the second ferroelectric film 24c, and can lower a write voltage and a read voltage applied to a capacitor.

Alternatively, the second ferroelectric film 24c may be made of a Bi layered compound such as $(Bi_{1-x}R_x)Ti_3O_{12}$ (R is a rare-earth element, and $0<x<1$), $SrBi_2Ta_2O_9$, or $SrBi_4Ti_4O_{15}$.

Moreover, a method of depositing the second ferroelectric film 24c is also not limited to sputtering. The second ferroelectric film 24c may be formed by the sol-gel method or MOCVD. In a case where MOCVD is employed, conditions similar to those for the first ferroelectric film 24b can be employed as deposition conditions for the second ferroelectric film 24c.

It should be noted, however, that for an undermentioned reason, the second ferroelectric film 24c is preferably a film in an amorphous state or a film made of microcrystals. It is most preferable to employ sputtering by which the second ferroelectric film 24c that is amorphous can be deposited.

Subsequently, as shown in FIG. 3J, while the silicon substrate 1 is being heated, an iridium oxide ($IrO_x$) film is formed as a first conductive metal oxide film 25d on the ferroelectric film 24 to a thickness of approximately 50 nm by reactive sputtering. It should be noted that the iridium oxide film formed by sputtering in which the silicon substrate 1 is heated as described above has already been crystallized at the time of deposition even if a process for crystallization is not performed.

Deposition conditions for the first conductive metal oxide film 25d are not particularly limited. In this embodiment, the substrate temperature is set at 300° C.; a gas mixture of argon gas having a flow rate of 140 sccm and oxygen gas having a flow rate of 10 to 90 sccm, e.g., 60 sccm, is used as sputtering gas; and the sputtering power is set at 1 kW to 2 kW.

Here, in the above-described sputtering of iridium oxide, iridium atoms flying off an iridium target are oxidized in the sputtering atmosphere, whereby iridium oxide is deposited on the substrate. Accordingly, part of the deposited iridium oxide is not sufficiently oxidized in the atmosphere. The iridium oxide film is, as a whole, prone to be in a state in which the amount of oxygen is smaller than in the stoichiometric composition ($IrO_2$).

Accordingly, when the chemical formula of iridium oxide of the stoichiometric composition is represented by $IrO_{x1}$, x1 is 2. Meanwhile, in the first conductive metal oxide film 25d formed under the aforementioned conditions, when the chemical formula of iridium oxide is represented by $IrO_{x2}$, x2 is a value approximately between 1.3 and 1.9. The ratio x2/x1 is considerably smaller than 1.

Here, the first ferroelectric film 24b suffers damage from sputtering gas when the second ferroelectric film 24c and the first conductive metal oxide film 25d are formed by sputtering. Moreover, the concentration of oxygen in the first ferroelectric film 24b is insufficient, and ferroelectric characteristics thereof may be deteriorated.

Accordingly, after the formation of the above-described first conductive metal oxide film 25d, RTA is performed in an oxidizing-gas-containing atmosphere, e.g., a mixed atmosphere of argon and oxygen. The damage suffered by the first ferroelectric film 24b from sputtering is thus recovered, and oxygen deficiency in the first ferroelectric film 24b is compensated.

Conditions for this RTA are not particularly limited. However, the substrate temperature is preferably set at a temperature of not less than 650° C., more preferably 700° C. to 750° C. In this embodiment, the substrate temperature is set at 725° C. Moreover, the flow rates of argon and oxygen are set respectively at 2000 sccm and 20 sccm, and the treatment time is set at 60 seconds.

It should be noted that the atmosphere for this RTA is not particularly limited as long as it is a mixed atmosphere of inert gas and oxidizing gas. As inert gas of these, any one of argon, nitrogen ($N_2$), and nitrogen dioxide can be employed.

Furthermore, since the second ferroelectric film 24c is formed to be amorphous, iridium atoms which diffuse into the ferroelectric film 24 from the first conductive metal oxide film 25d due to this RTA remain in the second ferroelectric film 24c, and become less prone to reach the first ferroelectric film 24b. As a result, iridium becomes less prone to diffuse into grain boundaries of the first ferroelectric film 24 which is crystallized to show excellent ferroelectric characteristics. Accordingly, leakage paths are prevented from being formed by the iridium, and it becomes possible to effectively prevent the leakage current of a ferroelectric capacitor.

The above-described advantage can also be obtained when the second ferroelectric film 24c is formed of a film made of microcrystals.

After the first conductive metal oxide film 25d is formed as described above, an iridium oxide film is formed as a second conductive metal oxide film 25e on the first conductive metal oxide film 25d to a thickness of approximately 100 to 300 nm, e.g., 200 nm, by reactive sputtering in which the substrate temperature is set at room temperature. The second conductive metal oxide film 25e is formed in a sputtering atmosphere at a pressure of 0.8 Pa by setting the sputtering power at 1.0 kW and setting the deposition time at 79 seconds.

Here, unlike the first conductive metal oxide film 25d crystallized at a high deposition temperature, the second conductive metal oxide film 25e formed by sputtering in which the substrate temperature is set at room temperature becomes in an amorphous state.

If the amount of oxygen is insufficient in the second conductive metal oxide film 25e, the catalysis of the second conductive metal oxide film 25e is improved. Accordingly, external moisture touches the second conductive metal oxide film 25e, and thus hydrogen is generated. Since hydrogen causes the problem that it reduces the ferroelectric film 24 to deteriorate ferroelectric characteristics thereof, the amount of hydrogen generated needs to be made as small as possible in the process of manufacturing an FeRAM.

Accordingly, from the viewpoint of preventing the generation of hydrogen, the oxidation number of iridium constituting the second conductive metal oxide film 25e is preferably larger than that of the first conductive metal oxide film 25d.

For this reason, in this embodiment, by setting the ratio of the oxygen flow rate to the total flow rate of sputtering gas for forming the second conductive metal oxide film 25e higher than that in the step of forming the first conductive metal oxide film 25d, the composition of iridium oxide is brought close to the stoichiometric composition ($IrO_2$) to suppress the catalysis of the second conductive metal oxide film 24e. With regard to the flow rates of sputtering gases at this time, for example, the flow rate of argon is set at 100 sccm, and that of oxygen is set at 100 sccm.

When the chemical formula of iridium oxide constituting the second conductive metal oxide film 24e is represented by $IrO_{y2}$, y2 is approximately 2 in a case where the above-described conditions are met. When the chemical formula of iridium oxide of stoichiometric composition is represented by $IrO_{y1}$, y1 is 2. Accordingly, the ratio y2/y1 is a value near 1, and the magnitude relationship with the ratio x2/x1 for the first conductive metal oxide film 25d is y2/y1>x2/x1.

The second conductive metal oxide film 25e and the first conductive metal oxide film 25d described above form a conductive metal oxide film 25b such as shown in the drawing.

The first conductive metal oxide film 25d has the function of blocking hydrogen by the action of oxygen in the film, and also has the role of protecting the capacitor dielectric film 24 from hydrogen.

It should be noted that a material for the first and second conductive metal oxide films 25d and 25e is not limited to iridium oxide.

However, in a case where the first ferroelectric film 24b is formed by MOCVD, if platinum oxide films are employed as the first and second conductive metal oxide films 25d and 25e, lead of PZT constituting the ferroelectric film 24 reacts with platinum. Accordingly, ferroelectric characteristics of the ferroelectric film 24 are deteriorated, and the remanent polarization charge amount of the ferroelectric film 24 decreases. Thus, in this case, as a material for the first and second conductive metal oxide films 25d and 25e, oxide of any one of iridium (Ir), ruthenium (Ru), rhodium (Rh), rhenium (Re), osmium (Os), and palladium (Pd) is preferably employed.

It should be noted, however, that if the above-described reaction between lead of PZT and platinum is insignificant, platinum oxide films may be employed as the first and second conductive metal oxide films 25d and 25e.

Moreover, as described previously, in order to prevent the generation of hydrogen in the second conductive metal oxide film 25e, it is preferable that the metal oxide constituting the second conductive metal oxide film 25e be more oxidized than the first conductive metal oxide film 25d. When the stoichiometric compositions of the metal oxides constituting the first and second conductive metal oxide films 25d and 25e are represented respectively by $AO_{x1}$ and $BO_{y1}$ (A and B are metal elements), and the actual compositions thereof after deposition are represented respectively by $AO_{x2}$ and $BO_{y2}$, the above-described conditions are represented by $y2/y1 > x2/x1$.

Furthermore, with regard to the thicknesses of the first and second conductive metal oxide films 25d and 25e, it is preferable that the first conductive metal oxide film 25d have a smaller thickness than that of the second conductive metal oxide film 25e.

This is because of the following reason. In the aforementioned RTA performed after the formation of the first conductive metal oxide film 25d, when the first conductive metal oxide film 25d is thinner, oxygen can more easily spread over the entire ferroelectric film 24. As a result, damage suffered by the ferroelectric film 24 can be effectively recovered. Moreover, since the second conductive metal oxide film 25e also has the role of blocking moisture and reducing substances such as hydrogen from a second interlayer insulating film to be formed later, if the thickness of the second conductive metal oxide film 25e is larger, the performance of blocking reducing substances is more improved.

Subsequently, as shown in FIG. 3K, an iridium film is formed as a conductivity-improving film 25c on the conductive metal oxide film 25b to a thickness of approximately 50 nm by sputtering. The sputtering is performed in an argon atmosphere at a pressure of 1 Pa, and a sputtering power of 1.0 kW is introduced into the sputtering atmosphere.

The conductivity-improving film 25c and the conductive metal oxide film 25b thereunder constitute a second conductive film 25. The conductivity-improving film 25c has the role of compensating the conductivity of the second conductive film 25, which is prone to be insufficient in a case where only the conductive metal oxide film 25b is used. Moreover, the conductivity-improving film 25c also has the role of blocking external hydrogen and preventing a deterioration of the ferroelectric film 24 because iridium, which is a material for the conductivity-improving film 25c, has excellent barrier properties against hydrogen.

It should be noted that instead of the iridium film, any one of a ruthenium film, a rhodium film, and a palladium film may be formed as the conductivity-improving film 25c.

Thereafter, the back surface of the silicon substrate 1 is cleaned.

Next, as shown in FIG. 3L, a titanium nitride film is formed on the second conductive film 25 by sputtering. The titanium nitride film is used as a first mask material layer 26.

Furthermore, a silicon oxide film is formed as a second mask material layer 27 on the first mask material layer 26 by plasma CVD using TEOS gas.

Then, as shown in FIG. 3M, the second mask material layer 27 is patterned into island-shaped portions, and thus a second hard mask 27a is formed.

Next, steps for obtaining the cross-sectional structure shown in FIG. 3N will be described.

First, the first mask material layer 26 is etched using the second hard mask 27a as a mask to form a first hard mask 26a.

Subsequently, portions of the second conductive film 25, the ferroelectric film 24, and the first conductive film 23, which are not covered with the first and second hard masks 26a and 27a, are dry-etched to form capacitors Q each including a lower electrode 23a, a capacitor dielectric film 24a and an upper electrode 25a.

Gas used in the dry etching is not particularly limited. A gas mixture of HBr and oxygen is used as etching gas for the first and second conductive films 23 and 25. On the other hand, a gas mixture of chlorine and argon is used as etching gas for the ferroelectric film 24.

Moreover, since the conductive oxygen barrier film 22 has etching resistance to the etching gas for the first conductive film 23, the conductive oxygen barrier film 22 is left on the entire surface of the crystalline conductive film 21 even after the capacitors Q are formed.

The lower electrodes 23a of the capacitors Q formed as described above are electrically connected to the first conductive plugs 32a through the conductive oxygen barrier film 22, the crystalline conductive film 21, and the third conductive plugs 36a.

Furthermore, since the ferroelectric film 24 and the first conductive film 23 are simultaneously etched as described previously, side surfaces of the capacitor dielectric films 24a and the lower electrodes 23a exist in the same planes.

Here, the first conductive film 23 formed into the lower electrodes 23a by the above-described etching has a two-layer structure including the lower conductive layer 23b made of platinum and the upper conductive layer 23c made of iridium. Accordingly, the proportion of iridium in the first conductive film 23 is smaller than that in a case where the first conductive film 23 has a single-layer structure formed of only an iridium film.

Accordingly, in the aforementioned etching of the capacitors Q, the number of iridium grains scattered from the side surfaces of the lower electrodes 23a into the etching atmosphere is reduced. This can reduce the number of iridium grains adhering to the side surfaces of the capacitor dielectric films 24a, and thus can prevent leakage paths from being formed between the lower and upper electrodes 23a and 25a by the iridium grains.

To effectively reduce the amount of iridium grains scattered, the thickness of each of the lower conductive layers 23b is preferably made larger than that of the corresponding upper conductive layer 23c made of iridium to reduce the proportion of the upper conductive layer 23c in the corresponding lower electrodes 23a. For example, each of the lower conductive layer 23bs is preferably formed to a thickness one to nine times that of the corresponding upper conductive layer 23c.

Subsequently, as shown in FIG. 3O, the second hard mask 27a made of silicon oxide is removed by wet etching using a mixed solution of hydrogen peroxide ($H_2O_2$), ammonia, and moisture as an etchant. It should be noted that the second hard mask 27a may be removed by dry etching.

Next, steps for obtaining the cross-sectional structure shown in FIG. 3P will be described.

First, using the first hard mask 26a (see FIG. 3O) as a mask, the crystalline conductive film 21 and the conductive oxygen barrier film 22 are etched in a way that these films are left only under the capacitors Q. This etching is performed by dry etching. As etching gas therefor, for example, a gas mixture of argon and chlorine is used.

Moreover, the first hard mask 26a is also etched by this etching gas. Accordingly, when the etching is finished, the first hard mask 26a is removed.

Subsequently, as shown in FIG. 3Q, an alumina ($Al_2O_3$) film for covering the capacitors Q is formed to a thickness of approximately 20 nm. The alumina film is used as a first capacitor protection insulating film 39. Alumina constituting the first capacitor protection insulating film 39 has excellent ability to prevent the permeation of hydrogen. Accordingly, external hydrogen is blocked by this first capacitor protection insulating film 39. Thus, the capacitor dielectric films 24a can be prevented from being deteriorated by hydrogen.

Here, the capacitor dielectric films 24a suffer damage due to the dry etching (see FIG. 3O) performed at the time of the formation of the capacitors Q and due to the deposition of the first capacitor protection insulating film 39 by sputtering.

Accordingly, in order to cause the capacitor dielectric films 24a to recover from this damage, recovery annealing is performed on the capacitor dielectric films 24a in an oxygen-containing atmosphere as shown in FIG. 3R. Conditions for this recovery annealing are not particularly limited. In this embodiment, the substrate temperature is set at 550° C. to 700° C., e.g., 650° C., in a furnace, and the recovery annealing is performed for approximately 60 minutes.

Subsequently, as shown in FIG. 3S, an alumina film is formed on the first capacitor protection insulating film 39 to a thickness of approximately 20 nm by CVD. This alumina film is used as a second capacitor protection insulating film 40.

Next, steps for obtaining the cross-sectional structure shown in FIG. 3T will be described.

First, a silicon oxide film is formed as a second interlayer insulating film 41 on the second capacitor protection insulating film 40 by plasma CVD using TEOS gas as reaction gas. In the reaction gas, oxygen gas and helium gas are also contained. Additionally, the thickness of the second interlayer insulating film 41 is not particularly limited. In this embodiment, the thickness thereof on the flat surface of the silicon substrate 1 is set at 1500 nm.

It should be noted that, instead of the silicon oxide film, an insulating inorganic film may be formed as the second interlayer insulating film 41.

Thereafter, the surface of the second interlayer insulating film 41 is polished and planarized by CMP.

Furthermore, as treatment of dehydrating the second interlayer insulating film 41, the surface of the second interlayer insulating film 41 is exposed to a $N_2O$ plasma. This $N_2O$ plasma removes moisture remaining in the second interlayer insulating film 41, and prevents moisture from being again absorbed by the second interlayer insulating film 41.

It should be noted that $N_2$ plasma treatment may be performed as this dehydrating treatment.

Subsequently, a flat alumina film is formed on the second interlayer insulating film 41 to a thickness of approximately 20 nm to 100 nm by sputtering. The alumina film is used as a third capacitor protection insulating film 42. This third capacitor protection insulating film 42 is formed on the second interlayer insulating film 41 which is planarized, and therefore does not have to have excellent coverage characteristics and is formed by inexpensive sputtering as described above. It should be noted, however, that a method of depositing the third capacitor protection insulating film 42 is not limited to sputtering and may be CVD.

Thereafter, as shown in FIG. 3U, a silicon oxide film is formed as a cap insulating film 43 on the third capacitor protection insulating film 42 to a thickness of approximately 800 to 1000 nm by plasma CVD using TEOS gas. It should be noted that a silicon oxynitride film or a silicon nitride film may be formed as this cap insulating film 43.

Furthermore, CMP may be performed on this cap insulating film 43 to planarize the surface thereof.

Next, steps for obtaining the cross-sectional structure shown in FIG. 3V will be described.

First, the first to third capacitor protection insulating films 39, 40, and 42, the second interlayer insulating film 41, and the cap insulating film 43 are patterned, whereby second holes 41a each having a depth which reaches the corresponding conductivity-improving film 25c (see FIG. 3K) are formed in these films on the upper electrodes 25a.

Then, in order to recover damage suffered by the capacitor dielectric films 24a in the foregoing steps, the silicon substrate 1 is placed in an unillustrated furnace, and recovery annealing in which the substrate temperature is set at 550° C. is performed in an oxygen atmosphere.

Next, the first to third capacitor protection insulating films 39, 40, 42, the second interlayer insulating film 41, the cap insulating film 43, the underlying insulating film 15, and the anti-oxidation insulating film 14 on the second conductive plugs 32b are patterned, and thus third holes 41b are formed in these films.

It should be noted that, when this patterning is performed, the second holes 41a are covered with a resist pattern, and are protected from the etching atmosphere by the resist pattern.

Here, if an attempt is made to simultaneously form these holes 41a and 41b, the upper electrodes 25a in the second holes 41a are exposed to the etching atmosphere for a long time until the third holes 41b, which are deeper, are formed, and the problem occurs that the capacitor dielectric films 24a deteriorate.

In this embodiment, since the second and third holes 41a and 41b having different depths from each other are separately formed as described previously, such a problem can be avoided.

Furthermore, the second conductive plugs 32b over the second source/drain regions 8b are covered with the anti-oxidation insulating film 14 until this step is finished. Accordingly, tungsten constituting the second conductive plugs 32b is prevented from being oxidized and causing a contact failure.

Subsequently, a titanium film and a titanium nitride film are formed in this order as a glue film on the cap insulating film 43 and in the second and third holes 41a and 41b by sputtering.

It should be noted that the titanium nitride film may be formed by MOCVD. In this case, in order to remove carbon from the titanium nitride film, it is preferable to anneal the titanium nitride film in an atmosphere made by converting nitrogen and hydrogen into a plasma. Even when annealing is performed in a hydrogen-containing atmosphere in this way, the conductivity-improving films 25c (see FIG. 3K) made of iridium and formed in the uppermost layers of the upper electrodes 25a block hydrogen, and therefore the conductive metal oxide films 25b are not reduced by hydrogen.

Moreover, the glue film is not limited to a film stack including a titanium film and a titanium nitride film. The glue film may be formed of a single-layer film made of any one of a titanium film, a titanium nitride film, a tantalum nitride film, and a titanium aluminum nitride film, or a film stack including any thereof.

Furthermore, a tungsten film is formed on the glue film by CVD, whereby the second and third holes 41a and 41b are fully filled with this tungsten film.

Then, unnecessary portions of the glue film and the tungsten film on the cap insulating film 43 are polished and removed by CMP in a way that these films are left only in the second and third holes 41a and 41b as fourth and fifth conductive plugs 47a and 47b.

Of these plugs, the fourth conductive plugs 47a are electrically connected to the upper electrodes 25a of the capacitors Q. On the other hand, each of the fifth conductive plugs 47b is electrically connected to the corresponding second conductive plug 32b, and constitutes part of a bit line together with the second conductive plug 32b.

Here, if the titanium nitride films partially constituting the glue films of the fourth conductive plugs 47a come into contact with the conductive metal oxide films 25b partially constituting the upper electrodes 25a, there is a disadvantage that the contact resistances between the upper electrodes 25a and the fourth conductive plugs 47a become high. In view of this point, in this embodiment, the conductivity-improving films 25c made of iridium are formed in the uppermost layers of the upper electrodes 25a. Accordingly, the contact resistances between the upper electrodes 25a and the fourth conductive plugs 47a can be made low.

Thereafter, as shown in FIG. 3W, a metal film stack is formed on the cap insulating film 43 and the conductive plugs 47a and 47b by sputtering, and this metal film stack is patterned to form metal interconnections 49a and a conductive pads 49b for the bit lines.

As the metal film stack, a titanium film having a thickness of 60 nm, a titanium nitride film having a thickness of 30 nm, a copper-containing aluminum film having a thickness of 360 nm, a titanium film having a thickness of 5 nm, and a titanium nitride film having a thickness of 70 nm are formed in this order.

By the above-described steps, the basic structure of the semiconductor device according to this embodiment is completed.

In this embodiment described above, as shown in FIG. 3H, the first conductive film 23, which become the lower electrodes 23a of the capacitors, has a two-layer structure including the lower conductive layer 23b made of platinum and the upper conductive layer 23c made of iridium.

The proportion of iridium in the first conductive film 23 is thus smaller than in the case where the first conductive film 23 has a single-layer structure formed of an iridium film. Accordingly, in the step (see FIG. 3N) of simultaneously etching the first conductive film 23 and the ferroelectric film 24, it becomes possible to reduce the number of iridium grains emitted from the first conductive film 23 into the etching atmosphere. As a result, it is possible to reduce the number of iridium grains adhering again to the side surfaces of the capacitor dielectric films 24a during the above-described etching, which in turn prevents leakage paths from being formed on the side surfaces of the capacitor dielectric films 24a due to the iridium grains. As a result, it is made possible to provide a semiconductor device including the high-quality capacitors Q.

From the viewpoint of reducing the number of iridium grains, a material for the lower conductive layer 23b is not particularly limited as long as it is a noble metal other than iridium. This is because a noble metal other than iridium does not emit a large number of grains unlike iridium even when etched, and does not greatly affect the leakage currents of the capacitors. Additionally, the noble metal other than iridium is etched to a certain extent by the etchant used in the step of wet-etching the second hard mask 27a (FIG. 3O). Accordingly, the scattered grains of the noble metal other than iridium are dissolved by the wet etching when the hard mask 27a is removed.

If focus is made only on reducing the iridium grains, one may consider that single layer made of noble metal other than iridium, such as platinum film, suffices for the first conductive film 23.

However, it is necessary that the first conductive film 23 has not only a function as the lower electrodes of the capacitors but also the function of improving the crystallinity of the ferroelectric film 24 on the first conductive film 23 by the crystallinity thereof. Since iridium films are excellent in this function, it is preferable that the first conductive film 23 have a two-layer structure and that an iridium film be formed in the upper conductive layer 23c which is the uppermost layer of the first conductive film 23, as in this embodiment.

It should be noted, however, that if the platinum film is formed as the upper most upper conductive layer 23c, interdiffusion occurs between lead contained in the ferroelectric film 24 made of PZT and platinum. Such interdiffusion deteriorates the ferroelectric characteristics of the ferroelectric film 24, such as the remanent polarization charge amount. For example, Japanese Unexamined Patent Application Publication No. 2000-91539 and Japanese Unexamined Patent Application Publication No. 2004-95638 have such a problem.

Furthermore, platinum is more expensive than other noble metals. Accordingly, from the viewpoint of preventing an increase in manufacturing cost, it is also not preferable to form a platinum film as the upper conductive layer 23c.

For these reasons, it is preferable to select a conductive material other than platinum as a material for the upper conductive layer 23c.

With regard to the selection of materials respectively for the lower and upper conductive layers 23b and 23c, the same is true in undermentioned embodiments.

(3) Second Embodiment

FIGS. 4A to 4L are cross-sectional views of a semiconductor device according to a second embodiment of the present invention in the process of being manufactured. It should be noted that, in these drawings, the same components as those described in the first embodiment are denoted by the same reference numerals as in the first embodiment and will not be further described below.

In the step of FIG. 3C of the first embodiment, the third conductive plugs 36a are formed by polishing the glue film 35 and the plug conductive film 36 by CMP.

However, for the slurry used in the CMP, the polishing speeds of the glue film 35 and the plug conductive film 36 are faster than that of the underlying insulating film 15. Thus, it is difficult to match the heights of the respective upper surfaces of the third conductive plugs 36a and the underlying insulating film 15 at the point in time when the CMP is finished.

Figure 4A:
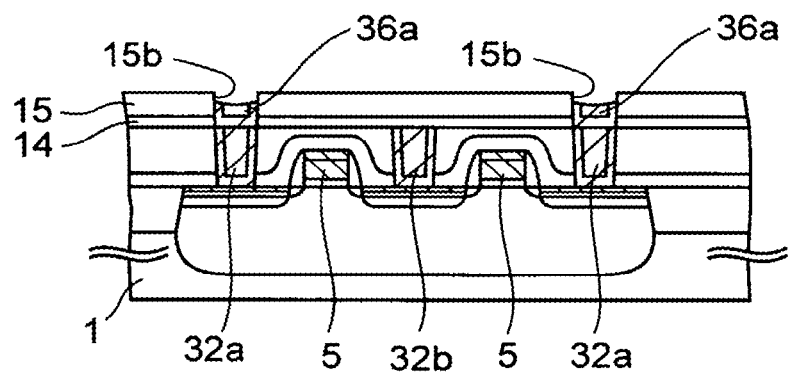
FIGS. 4A to 4L are cross-sectional views of a semiconductor device according to a second embodiment of the present invention in the process of being manufactured.

For this reason, as shown in FIG. 4A, recesses 15b are actually formed in the underlying insulating film 15 after the above-described CMP, and the heights of the upper surfaces of the third conductive films 36a become lower than that of the underlying insulating film 15. The depth of each of the recesses 15b is 20 to 50 nm, typically approximately 50 nm.

However, if such recesses 15b exist, the orientation of lower electrodes and capacitor dielectric films is disturbed, and the problem occurs that ferroelectric characteristics of the capacitor dielectric films deteriorate.

To solve this problem, in this embodiment, the following steps are performed.

Figure 4B:
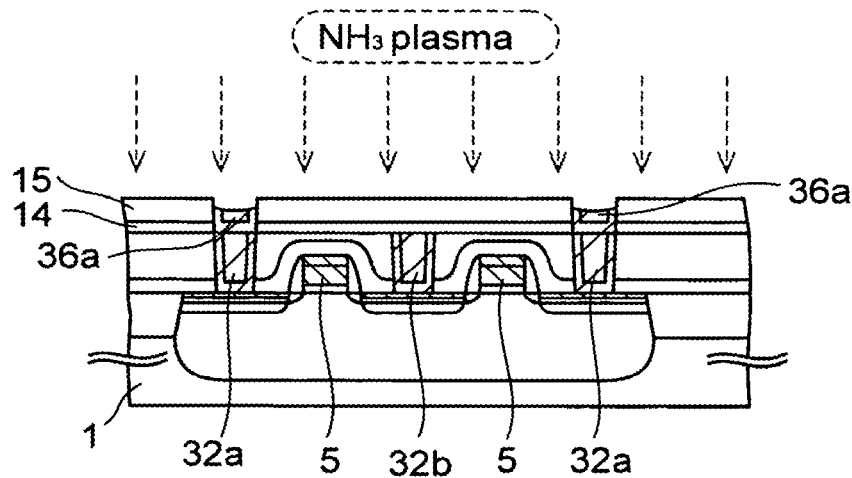

First, as shown in FIG. 4B, ammonia plasma treatment is performed on the underlying insulating film 15, whereby NH groups are bonded to oxygen atoms on the surface of the underlying insulating film 15.

In this ammonia plasma treatment, for example, a parallel-plate plasma treatment system is used, which has a counter electrode at a distance of approximately 9 mm (350 mils) from the silicon substrate 1. While the substrate temperature is being maintained at 400° C. at a pressure of 266 Pa (2 Torr), ammonia gas is supplied to the inside of a chamber at a flow rate of 350 sccm, and the treatment is performed by supplying a high-frequency power of 100 W at 13.56 MHz to the silicon substrate 1 and a high-frequency power of 55 W at 350 kHz to the above-described counter electrode for 60 seconds.

Figure 4C:
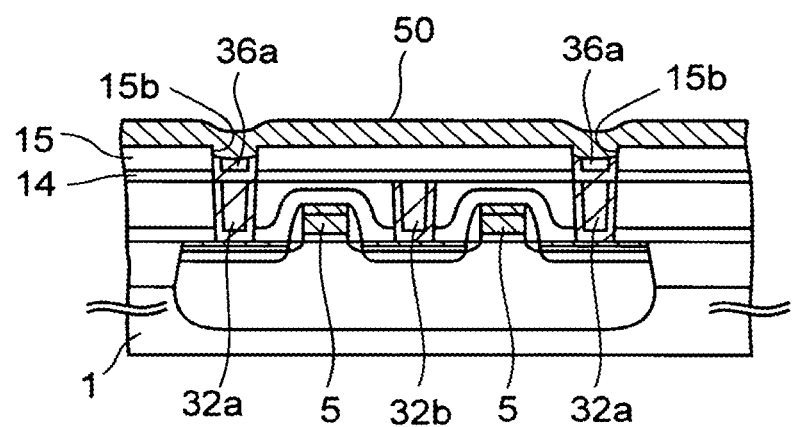

Next, as shown in FIG. 4C, a titanium film is formed as a planarization conductive film 50 on the underlying insulating film 15 and the third conductive plugs 36a to a thickness of 100 to 300 nm, e.g., approximately 100 nm. The recesses 15b are fully filled with this planarization conductive film 50.

Deposition conditions for this planarization conductive film 50 are not particularly limited. In this embodiment, a sputtering system is used in which the distance between the silicon substrate 1 and a titanium target is set at 60 mm, and the planarization conductive film 50 is formed in an argon atmosphere at a pressure of 0.15 Pa by applying a sputtering DC power of 2.6 kW for 35 seconds under conditions in which the substrate temperature is 20° C.

Moreover, before the planarization conductive film 50 is formed, NH groups have been bonded to oxygen atoms on the surface of the underlying insulating film 15 by ammonia plasma treatment (FIG. 4B). For this reason, titanium atoms deposited on the underlying insulating film 15 are less prone to be captured by oxygen atoms. As a result, the titanium atoms can freely move on the surface of the underlying insulating film 15, and it becomes possible to form the planarization conductive film 50 made of titanium which is strongly self-assembled in the (002) direction.

It should be noted that the planarization conductive film 50 is not limited to a titanium film. Any one of a tungsten film, a silicon film, and a copper film may be formed as the planarization conductive film 50.

Thereafter, RTA in which the substrate temperature is set at 650° C. is performed on the planarization conductive film 50 in a nitrogen atmosphere to nitride the planarization conductive film 50 made of titanium, and thus the planarization conductive film 50 of titanium nitride oriented in the (111) direction is formed.

Here, recessed portions are formed in the upper surface of the above-described planarization conductive film 50, reflecting the recesses 15b formed in the underlying insulating film 15 around the third conductive plugs 36a as described previously. However, if such recessed portions are formed, the crystallinity of a ferroelectric film to be formed above the planarization conductive film 50 later may deteriorate.

Figure 4D:
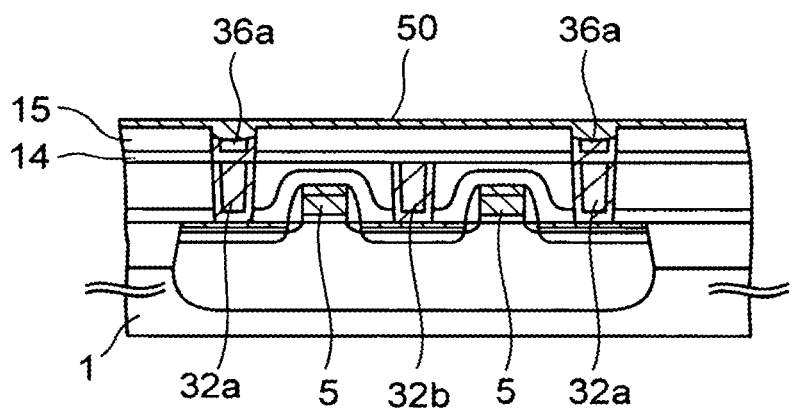

Accordingly, in this embodiment, as shown in FIG. 4D, the upper surface of the planarization conductive film 50 is polished and planarized by CMP, thus removing the above-described recessed portions. Slurry used in this CMP is not particularly limited. In this embodiment, SSW2000 manufactured by Cabot Microelectronics Corporation is used.

It should be noted that the thickness of the planarization conductive film 50 after CMP varies in the plane of the silicon substrate and among a plurality of silicon substrates due to polishing error. In this embodiment, in consideration of the variations, a target value of the thickness of the planarization conductive film 50 after CMP is set at 50 to 100 nm, more preferably 50 nm, by controlling the polishing time.

After CMP is performed on the planarization conductive film 50 as described above, crystals in the vicinity of the upper surface of the planarization conductive film 50 are distorted due to polishing. However, if lower electrodes of capacitors are formed above the planarization conductive film 50 in which crystals are thus distorted as described above, the lower electrodes are affected by the distortion, and the crystallinity of the lower electrodes deteriorate. Consequently, ferroelectric characteristics of the ferroelectric films thereon deteriorate.

Figure 4E:
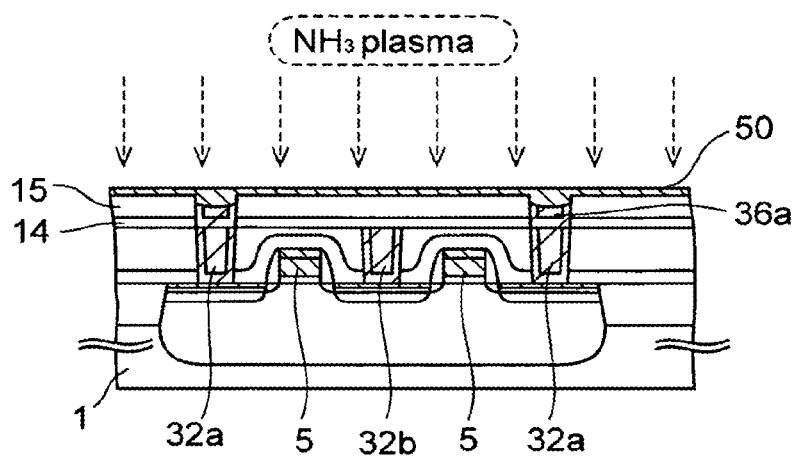

In order to avoid such a disadvantage, in the next step, as shown in FIG. 4E, the upper surface of the planarization conductive film 50 is exposed to an ammonia plasma so that the distortion of crystals of the planarization conductive film 50 is not transferred to a film thereon.

Figure 4F:
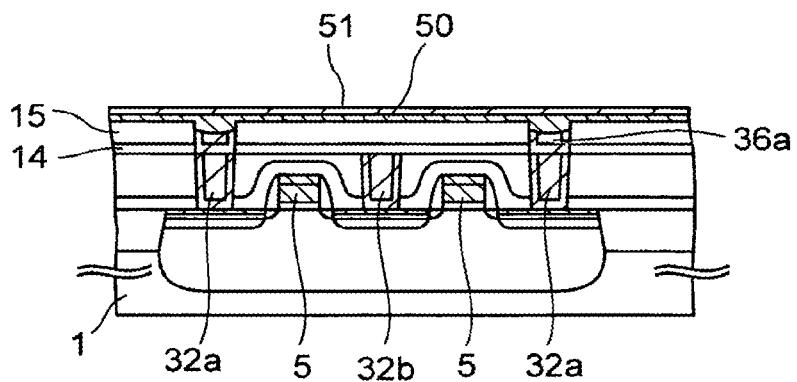

Next, as shown in FIG. 4F, an iridium film is formed as a conductive adhesive film 51 by sputtering on the planarization conductive film 50 in which the distortion of crystals is eliminated by the above-described ammonia plasma treatment. The conductive adhesive film 51 functions as a film for improving the adhesion strength between films formed thereon and thereunder. The thickness of the conductive adhesive film 51 is preferably formed to be as small as possible, e.g., not more than 20 nm, more preferably 5 nm to 10 nm.

Figure 4G:
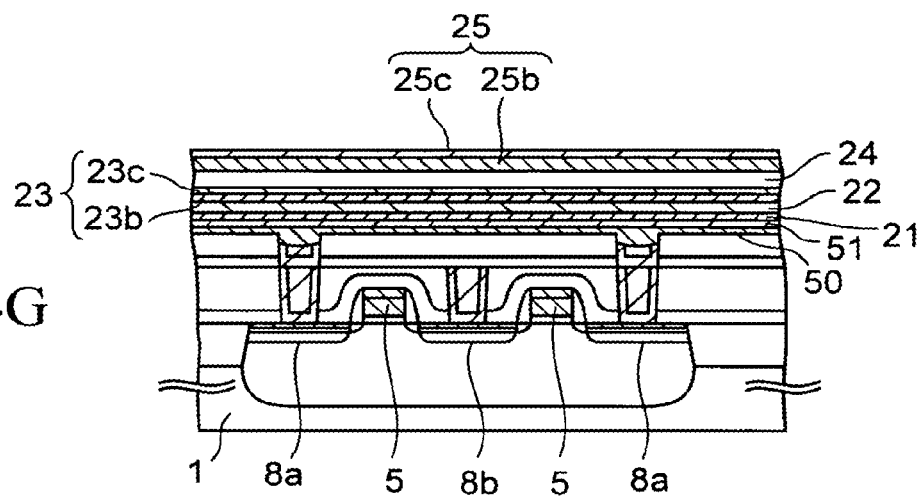

Subsequently, by performing the steps of FIGS. 3E to 3K described in the first embodiment, the crystalline conductive film 21 to the second conductive film 25 are stacked as shown in FIG. 4G.

Figure 4H:
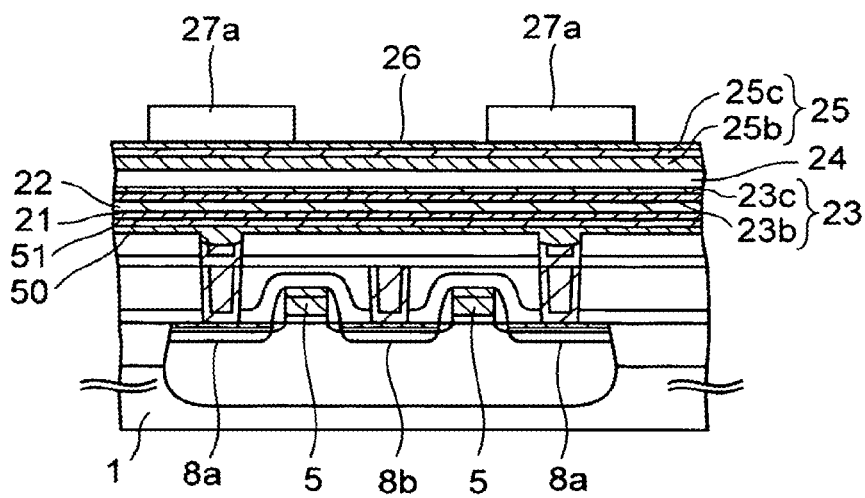

Subsequently, by performing the steps described using FIGS. 3L and 3M, the first mask material layer 26 and the second hard mask 27a are formed on the second conductive film 25 as shown in FIG. 4H.

Figure 4I:
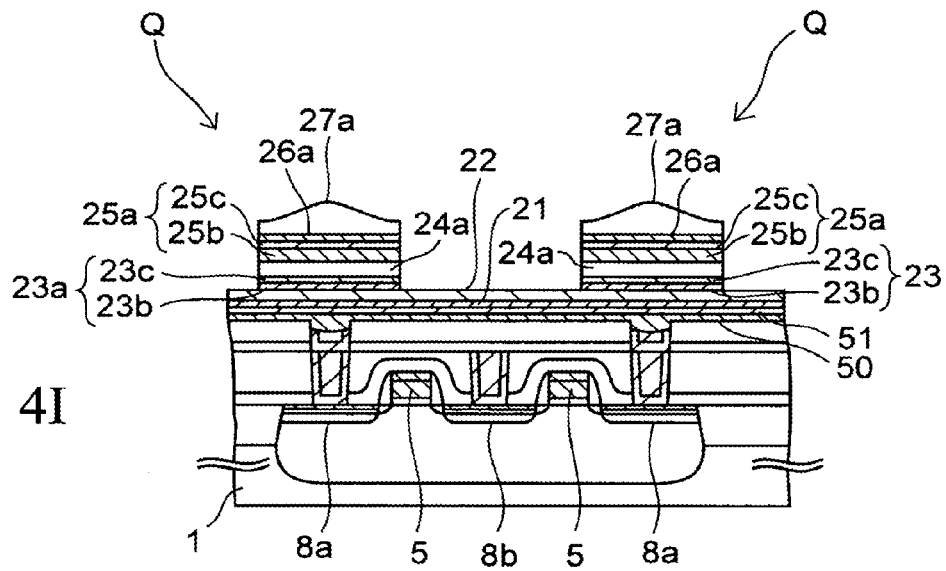

Next, as shown in FIG. 4I, the first mask material layer 26 is etched using the second hard mask 27a as a mask, and thereby the first hard mask 26a is formed.

Thereafter, portions of the second conductive film 25, the ferroelectric film 24, and the first conductive film 23, which are not covered with the first and second hard masks 26a and 27a, are dry-etched, and thus the capacitors Q each including the upper electrode 25a, the capacitor dielectric film 24a and the lower electrode 23a are formed.

In the etching, as in the first embodiment, a gas mixture of HBr and oxygen is used as etching gas for the first and second conductive films 23 and 25, and a gas mixture of chlorine and argon is used as etching gas for the ferroelectric film 24.

Here, the first conductive film 23 is formed of the lower conductive layer 23b made of platinum and the upper conductive layer 23c made of iridium as described in the first embodiment. Accordingly, the number of iridium grains scattered from the first conductive film 23 during this etching is reduced compared with that in a case where the entire first conductive film 23 is formed of iridium. By this way, leakage paths are prevented from being formed by iridium adhering again to the side surfaces of the capacitor dielectric films 24a, and it becomes possible to reduce the leakage currents between the upper and lower electrodes 25a and 23a.

Figure 4J:
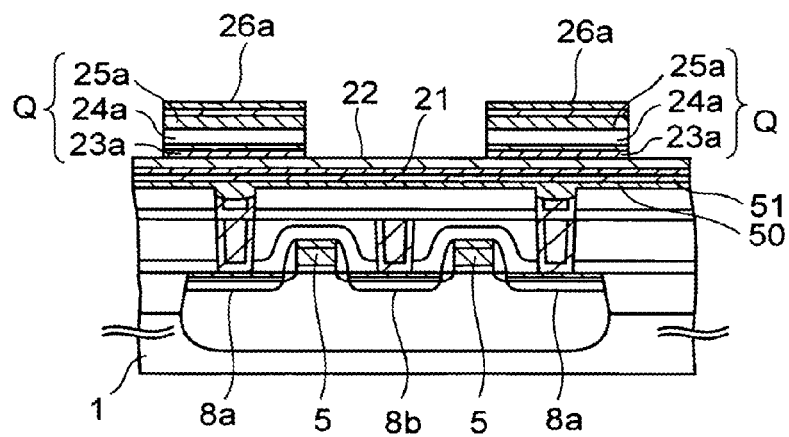

Subsequently, as shown in FIG. 4J, the second hard mask 27a made of silicon oxide is removed by wet etching using a mixed solution of hydrogen peroxide, ammonia, and moisture as an etchant. It should be noted that the second hard mask 27a may be removed by dry etching.

Figure 4K:
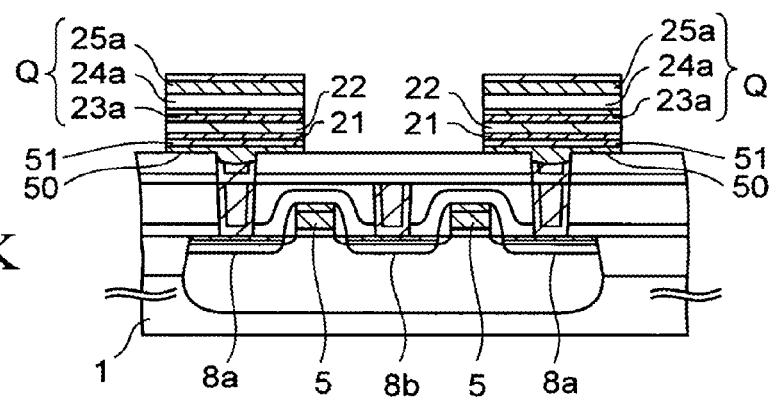

Next, steps for obtaining the cross-sectional structure shown in FIG. 4K will be described.

First, using the first hard mask 26a (see FIG. 4J) as a mask, portions of the conductive oxygen barrier film 22, the crystalline conductive film 21, the conductive adhesive film 51, and the planarization conductive film 50 which protrude from the lower electrodes 23a are etched in a way that these films are left only under the capacitors Q. This etching is performed by dry etching. As etching gas therefor, for example, a gas mixture of argon and chlorine is used.

Moreover, the first hard mask 26a is also etched by this etching gas. Accordingly, when the etching is finished, the first hard mask 26a is removed.

Figure 4L:
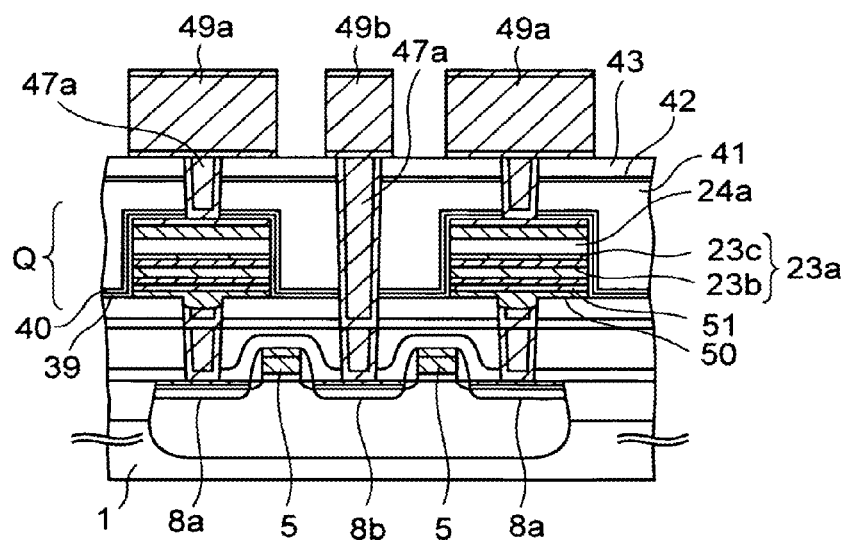

Thereafter, by performing the steps of FIGS. 3Q to 3W described in the first embodiment, the basic structure of the semiconductor device according to this embodiment such as shown in FIG. 4L is completed.

According to this embodiment described above, as described with reference to FIGS. 4C and 4D, the recesses 15b formed around the third conductive plugs 36a by CMP are filled with the planarization conductive film 50, and further the planarization conductive film 50 is planarized by CMP.

By this way, the flatness of the lower electrodes 23a (see FIG. 4K) formed above the planarization conductive film 50 becomes favorable, and the orientation of the lower electrodes 23a becomes favorable. Additionally, the orientation of the capacitor dielectric films 24a is also improved by the action of the orientation of the lower electrodes 23a, and ferroelectric characteristics such as remanent polarization charge amounts of the capacitor dielectric films 24a are improved.

Also, as in the first embodiment, the first conductive film 23 has a two-layer structure including the lower and upper conductive films 23b and 23c. Accordingly, in the step of simultaneously etching the ferroelectric film 24 and the first conductive film 23 (FIG. 4I), the number of iridium grains scattered from the first conductive film 23 can be reduced, and leakage paths can be prevented from being formed due to the iridium grains.

(4) Third Embodiment

Figure 5:
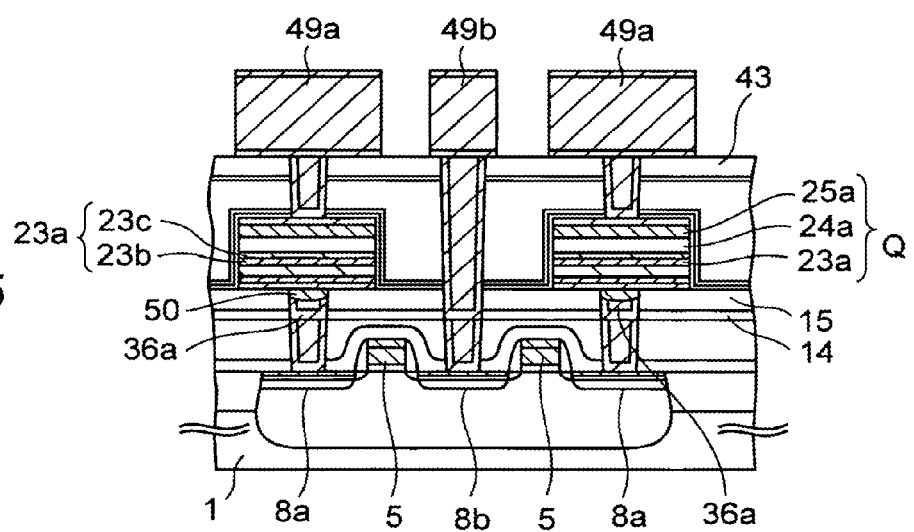
FIG. 5 is a cross-sectional view of a semiconductor device according to a third embodiment of the present invention.

FIG. 5 is a cross-sectional view of a semiconductor device according to this embodiment.

This embodiment differs from the second embodiment in the following point. In this embodiment, in the CMP step of FIG. 4D, the planarization conductive film 50 is removed from the upper surface of the underlying insulating film 15 in a way that the planarization conductive film 50 is left only in the recesses 15b. In other points, this embodiment and the second embodiment are the same.

Also in this embodiment, as the layer structure of each of the lower electrodes 23a, a two-layer structure is employed, which includes the lower conductive layer 23b made of platinum and the upper conductive layer 23c made of iridium.

Accordingly, for the same reason as described in the first embodiment, it is possible to reduce the number of iridium grains adhering again to the side surfaces of the capacitor dielectric films 24a when the lower electrodes 23a are formed by etching. Accordingly, leakage paths due to iridium grains can be prevented from being formed in the capacitors Q.

(5) Fourth Embodiment

Figure 6A:
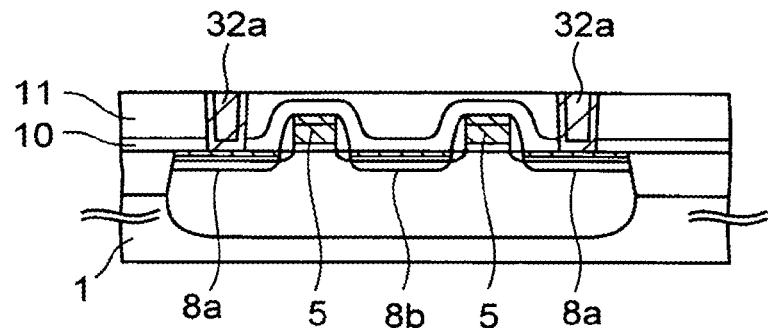
FIGS. 6A to 6O are cross-sectional views of a semiconductor device according to a fourth embodiment of the present invention in the process of being manufactured.
Figure 6B:
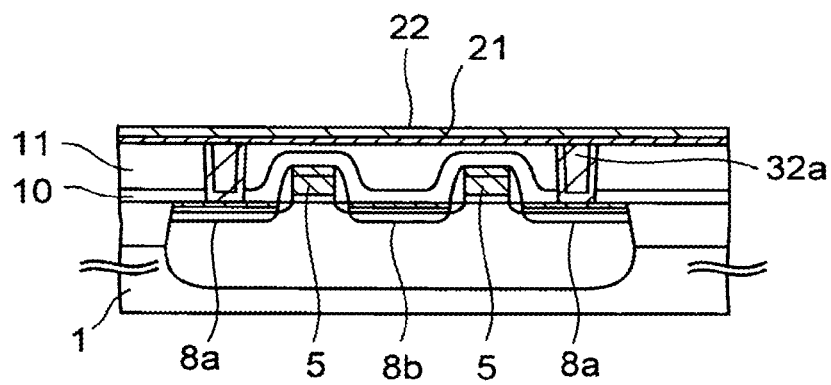
Figure 6C:
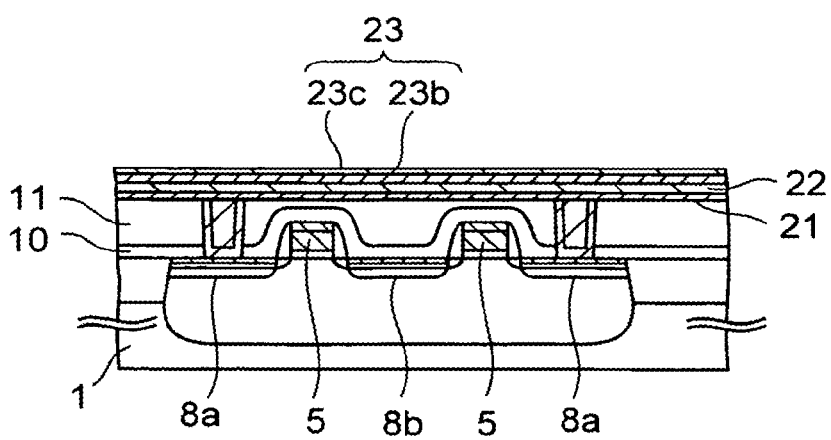
Figure 6D:
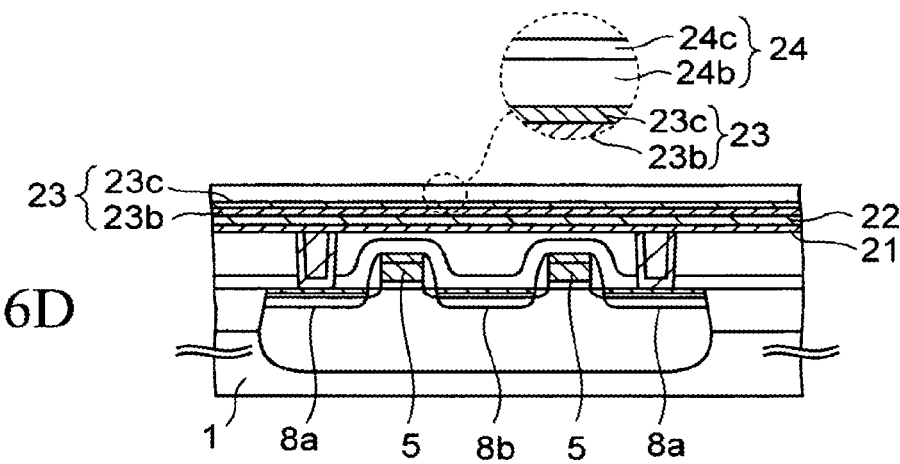
Figure 6E:
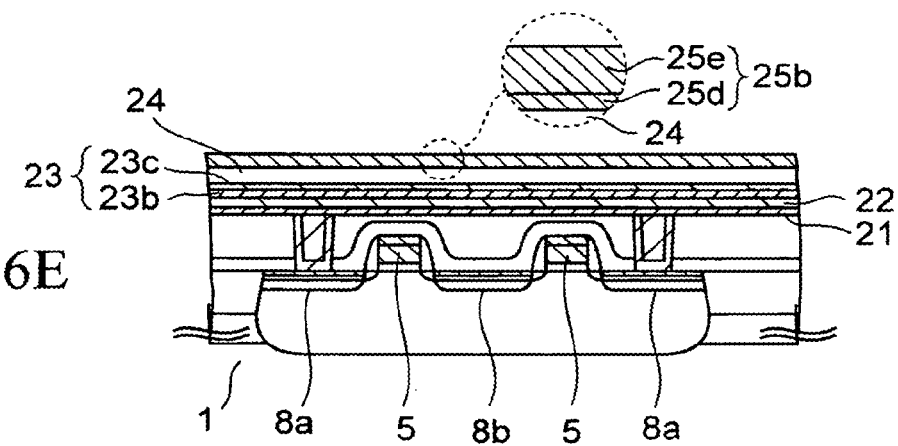
Figure 6F:
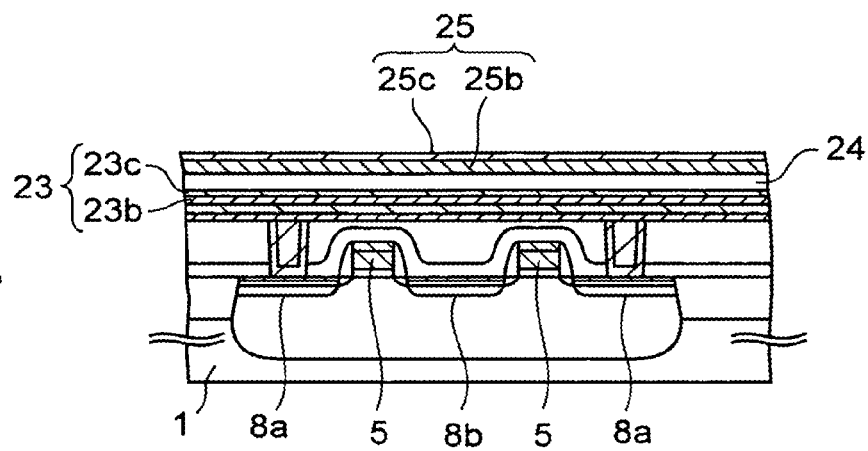
Figure 6G:
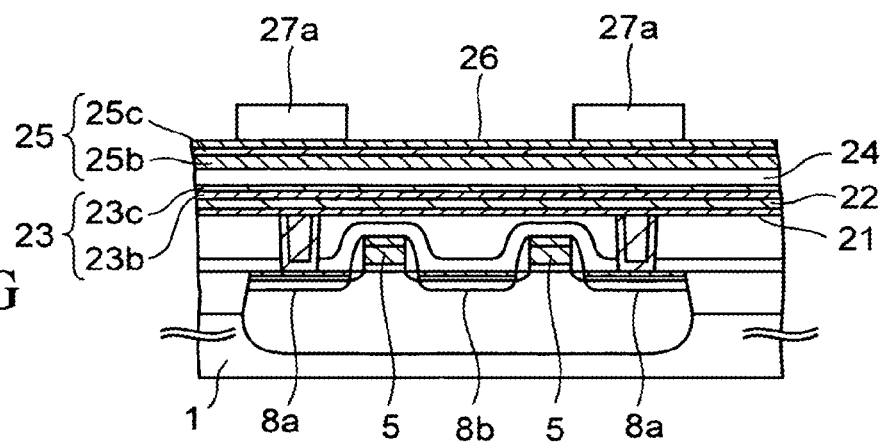
Figure 6H:
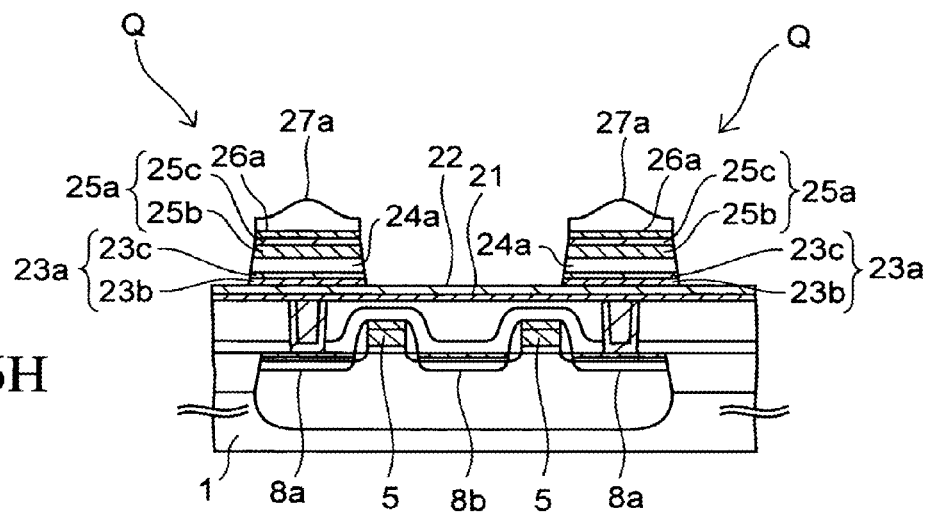
Figure 6I:
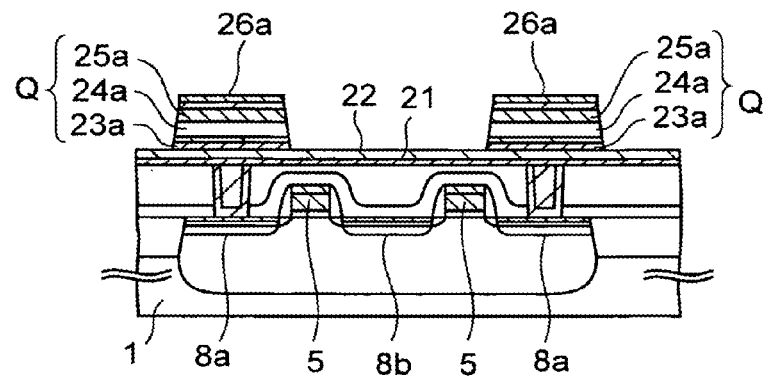
Figure 6J:
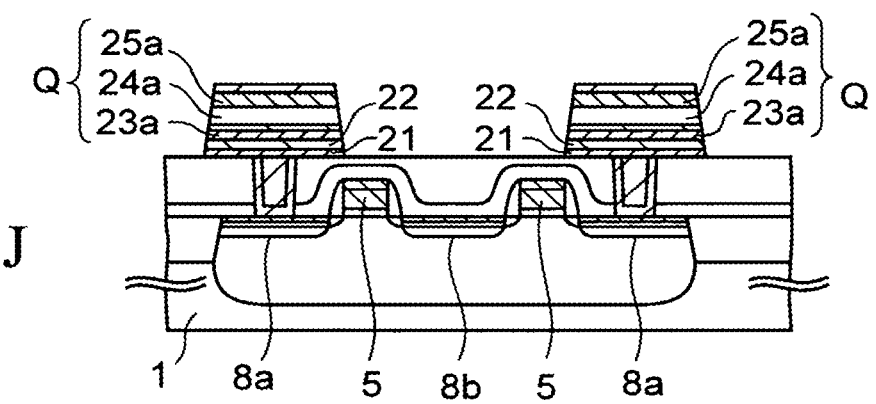
Figure 6K:
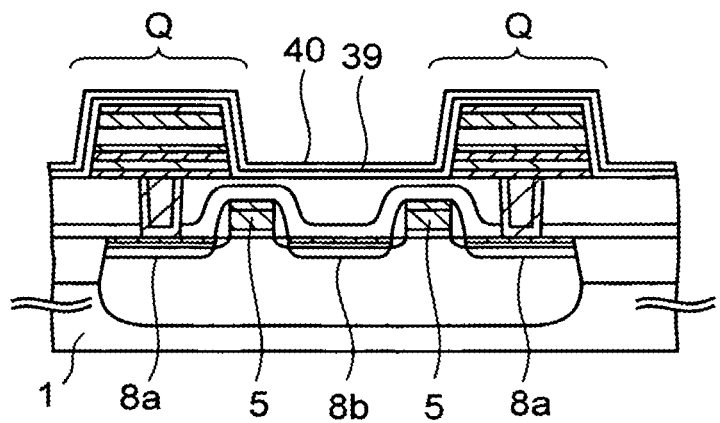
Figure 6L:
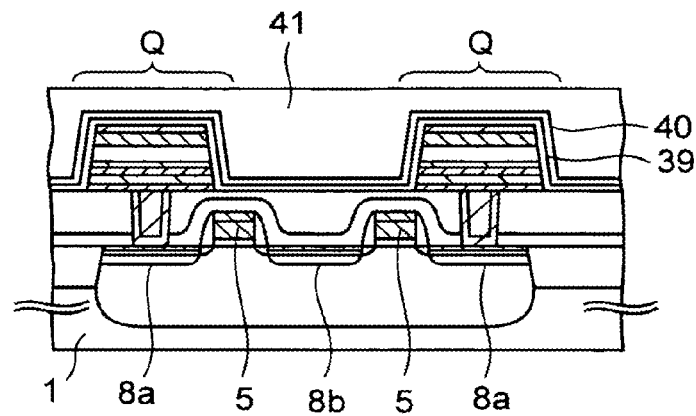
Figure 6M:
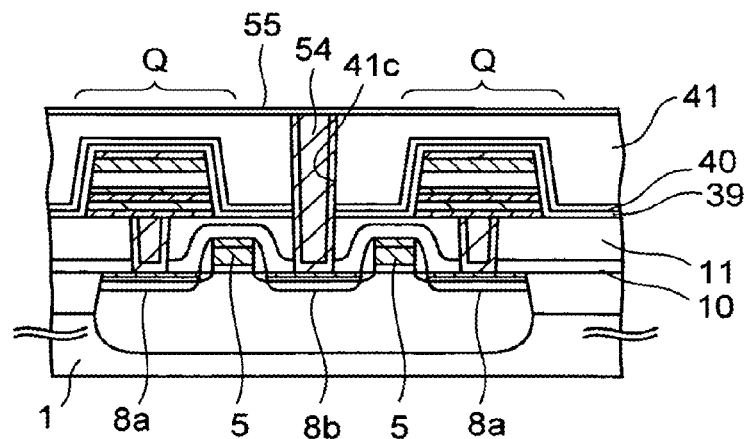
Figure 6N:
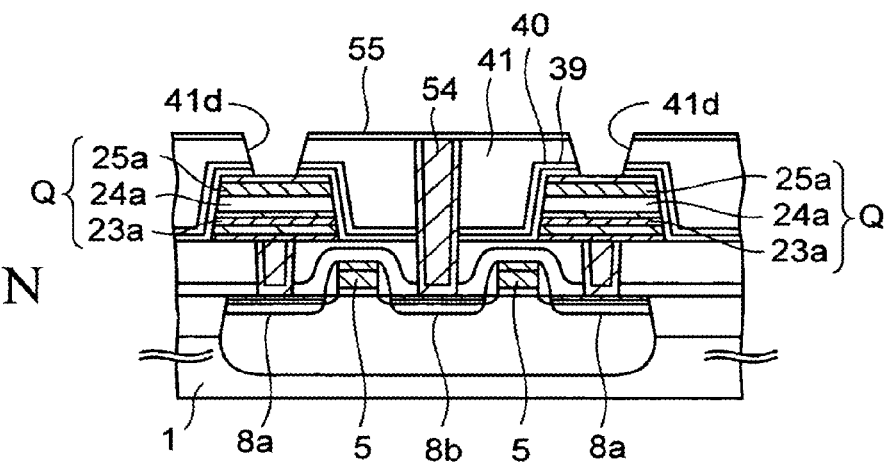
Figure 6O:
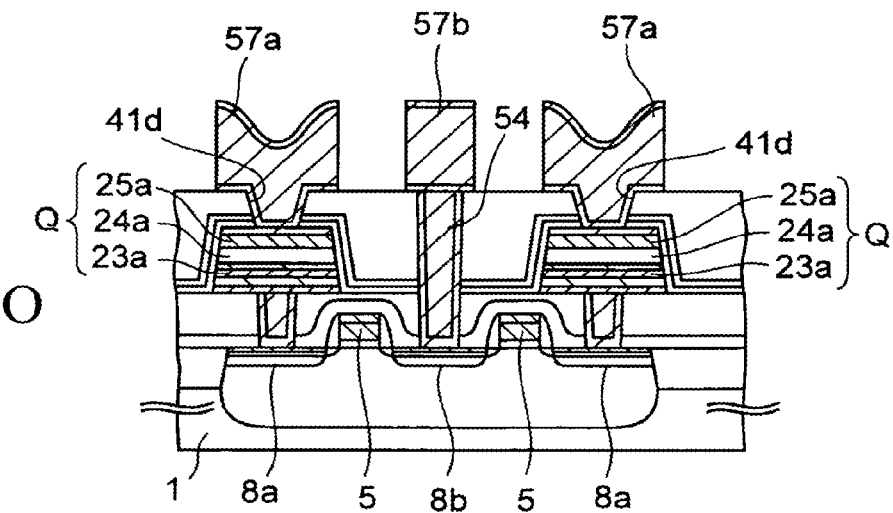

FIGS. 6A to 6O are cross-sectional views of a semiconductor device according to this embodiment in the process of being manufactured. It should be noted that in these drawings, the same components as those described in the first embodiment are denoted by the same reference numerals as in the first embodiment and will not be further described below.

At the beginning, steps for obtaining the cross-sectional structure shown in FIG. 6A will be described.

First, according to the step described with reference to FIG. 3A of the first embodiment, the cover insulating film 10 and the first interlayer insulating film 11 are formed on the silicon substrate 1. These insulating films are patterned, and thereby contact holes are formed respectively over the first source/drain regions 8a.

Moreover, a glue film and a tungsten film are formed in this order in these contact holes. Then, unnecessary portions of the glue film and the tungsten film on the first interlayer insulating film 11 are polished and removed by CMP in a way that these films are left only in the contact holes as the first conductive plugs 32a.

Next, as shown in FIG. 6B, a titanium film is formed on the first interlayer insulating film 11 and the first conductive plugs 32a to a thickness of approximately 20 nm. This titanium film is used as the crystalline conductive film 21.

It should be noted that ammonia plasma treatment may be performed in advance on the respective upper surfaces of the first interlayer insulating film 11 and the first conductive plugs 32a before this crystalline conductive film 21 is formed. By performing this ammonia plasma treatment, titanium atoms deposited on the first interlayer insulating film 11 become less prone to be captured by oxygen atoms on the surface of the insulating film 11. Accordingly, the titanium atoms can freely move on the surface of the first interlayer insulating film 11, and it becomes possible to form the crystalline conductive film 21 made of titanium which is strongly self-assembled in the (002) direction.

Thereafter, RTA, in which the substrate temperature and the treatment time are set respectively at 650° C. and 60 seconds, is performed on the crystalline conductive film 21 in a nitrogen atmosphere. Accordingly, the crystalline conductive film 21 made of titanium is nitrided, and the crystalline conductive film 21 is made of titanium nitride oriented in the (111) direction.

Furthermore, a titanium aluminum nitride film is formed as the conductive oxygen barrier film 22 on this crystalline conductive film 21 to a thickness of 100 nm by reactive sputtering.

Subsequently, as shown in FIG. 6C, a platinum film is formed as the lower conductive layer 23b of the first conductive film on the conductive oxygen barrier film 22 to a thickness of 60 nm by sputtering. The platinum film is formed, for example, in an argon atmosphere at a pressure of 0.2 Pa by setting the substrate temperature at 400° C. and the sputtering power at 0.5 kW.

It should be noted that a material for this lower conductive layer 23b is not particularly limited as long as it is a noble metal other than iridium, and the lower conductive layer 23b may be formed of rhodium or palladium.

Subsequently, an iridium film is formed on the lower conductive layer 23b to a thickness of 40 nm. This iridium film is used as the upper conductive layer 23c of the first conductive film. Deposition conditions for this iridium film are not particularly limited. In this embodiment, the following conditions are employed: an argon atmosphere at a pressure of 0.11 Pa, a substrate temperature of 500° C., and a sputtering power of 0.3 kW.

Furthermore, a conductive material constituting the upper conductive layer 23c is not limited to iridium, and may be any one of ruthenium, iridium oxide, ruthenium oxide, and $SrRuO_3$.

By this way, the first conductive film 23 including the lower and upper conductive layers 23b and 23c is formed on the conductive barrier film 22.

Subsequently, as shown in FIG. 6D, a PZT film is formed on the first conductive film 23 by MOCVD. This PZT film is used as the first ferroelectric film 24b.

The first ferroelectric film 24b is not limited to a PZT film. A film in which the crystal structure is changed to a Bi layered structure or a perovskite structure by heat treatment may be formed as the first ferroelectric film 24b. Of these, films in which the crystal structure is changed to a perovskite structure include a PZT film doped with a very small amount of any one of lanthanum, calcium, strontium, and silicon.

On the other hand, films in which the crystal structure is changed to a Bi layered structure include a $(Bi_{1-x}R_x)Ti_2O_{12}$ (R is a rare-earth element, and $0<x<1$) film, a $SrBi_2Ta_2O_9$ film, and a $SrBi_4Ti_4O_{15}$ film.

Subsequently, an amorphous PZT film is formed as the second ferroelectric film 24c on the first ferroelectric film 24b by sputtering. The first and second ferroelectric films 24b and 24c are used as the ferroelectric film 24.

The second ferroelectric film 24c is not limited to a PZT film. Similar to the first ferroelectric film 24b, a PZT film doped with a very small amount of any one of lanthanum, calcium, strontium, and silicon may be formed as the second ferroelectric film 24c. Alternatively, the second ferroelectric film 24c may be formed of a material having a Bi layered structure such as $(Bi_{1-x}R_x)Ti_3O_{12}$ (R is a rare-earth element, and $0<x<1$), $SrBi_2Ta_2O_9$, or $SrBi_4Ti_4O_{15}$.

Subsequently, as shown in FIG. 6E, by performing the step of FIG. 3J described in the first embodiment, the first and second conductive metal oxide films 25d and 25e both made of iridium oxide are formed on the ferroelectric film 24. These conductive metal oxide films 25d and 25e are used as the conductive metal oxide film 25d.

Furthermore, as shown in FIG. 6F, by performing the step of FIG. 3K of the first embodiment, the conductivity-improving film 25c made of iridium is formed on the conductive metal oxide film 25b. By this way, the second conductive film 25 formed of the conductive metal oxide film 25b and the conductivity-improving film 25c is formed on the ferroelectric film 24.

Next, as shown in FIG. 6G, the first mask material layer 26 made of titanium nitride is formed on the second conductive film 25 by sputtering.

Furthermore, a silicon oxide film is formed on the first mask material layer 26 by plasma CVD using TEOS gas, and the silicon oxide mask is patterned to form the second hard mask 27a.

Subsequently, as shown in FIG. 6H, the first mask material layer 26 is etched using the second hard mask 27a as a mask, and thereby the first hard mask 26a is formed.

Subsequently, portions of the second conductive film 25, the ferroelectric film 24, and the first conductive film 23 which are not covered with the first and second hard masks 26a and 27a are dry-etched, and thus the capacitors Q each including the lower electrode 25a, the capacitor dielectric film 24a and the upper electrode 23a, are formed.

It should be noted that conditions for this dry etching have been described with reference to FIG. 3N in the first embodiment and therefore will not be further described.

In addition, even though the above-described dry etching is performed, the conductive oxygen barrier film 22 is left on the entire surface of the crystalline conductive film 21 without being etched.

Here, the first conductive film 23 is formed of the lower conductive layer 23b made of platinum and the upper conductive layer 23c made of iridium as described previously. Accordingly, the proportion of iridium in the first conductive layer 23 is smaller compared with that in a case where the entire first conductive film 23 is formed of iridium. For this reason, in this etching, it is possible to reduce the number of iridium grains scattered from the side surfaces of the lower electrodes 23a into the etching atmosphere, and to prevent leakage paths from being formed on the side surfaces of the capacitor dielectric films 24a by the iridium grains.

Next, as shown in FIG. 6I, the second hard mask 27a is removed by wet etching or dry etching. In the case of wet etching, a mixed solution of hydrogen peroxide, ammonia, and moisture is used as an etchant.

Subsequently, steps for obtaining the cross-sectional structure shown in FIG. 6J will be described.

First, using the first hard mask 26a (see FIG. 6I) as a mask and using a gas mixture of argon and chlorine as etching gas, the crystalline conductive film 21 and the conductive oxygen barrier film 22 are dry-etched in a way that these films are left only under the capacitors Q.

It should be noted that, since the first hard mask 26a is also etched by this etching gas, the first hard mask 26a is removed when the etching is finished, and the upper surfaces of the upper electrodes 25a are exposed.

Next, as shown in FIG. 6K, in order to protect the capacitors Q from reducing substances such as hydrogen, an alumina film is formed as the first capacitor protection insulating film 39 over the entire upper surface of the silicon substrate 1 to a thickness of approximately 20 nm.

Then, in order to recover damage suffered by the capacitor dielectric films 24a during the dry etching (see FIG. 6I) performed when the capacitors Q are formed and during the deposition of the first capacitor protection insulating film 39 by sputtering, recovery annealing is performed on the capacitor dielectric films 24a in an oxygen-containing atmosphere. With regard to conditions for this recovery annealing, the substrate temperature is set at a temperature of 550° C. to 700° C., e.g., 650° C., in a furnace, and the recovery annealing is performed for approximately 60 minutes.

Thereafter, an alumina film is formed on the first capacitor protection insulating film 39 to a thickness of approximately 20 nm by CVD. This alumina film is used as the second capacitor protection insulating film 40.

Subsequently, as shown in FIG. 6L, a silicon oxide film is formed as the second interlayer insulating film 41 on the second capacitor protection insulating film 40 by plasma CVD using TEOS gas as reaction gas. In the reaction gas, oxygen gas and helium gas are also contained. In addition, the second interlayer insulating film 41 has a thickness of 1500 nm on the flat surface of the silicon substrate 1.

It should be noted that, instead of the silicon oxide film, an insulating inorganic film may be formed as the second interlayer insulating film 41.

Thereafter, the surface of the second interlayer insulating film 41 is polished and planarized by CMP.

Next, steps for obtaining the cross-sectional structure shown in FIG. 6M will be described.

First, the surface of the second interlayer insulating film 41 is exposed to a $N_2O$ plasma, and thereby moisture remaining in the second interlayer insulating film 41 is removed and is prevented from being reabsorbed by the second interlayer insulating film 41.

It should be noted that $N_2$ plasma treatment may be performed as this dehydrating treatment.

Subsequently, the cover insulating film 10, the first and second interlayer insulating films 11 and 41, and the first and second capacitor protection insulating films 39 and 40 are patterned, and thereby a first holes 41c are formed in these insulating films over the second source/drain regions 8b.

Furthermore, a glue film and a tungsten film are formed in this order in each of these first holes 41c. Then, unnecessary portions of the glue film and the tungsten film on the second interlayer insulating film 41 are polished and removed by CMP in a way that these films are left only in the first hole 41c as a second conductive plug 54.

The second conductive plug 54 constitutes part of a bit line and is electrically connected to the second source/drain region 8b.

The second conductive plug 54 consists primarily of tungsten prone to be oxidized, and is therefore prone to cause a contact failure if oxidized in the process.

For this reason, in order to prevent the oxidation of the second conductive plug 54, a silicon oxynitride film is formed on the respective upper surfaces of the second interlayer insulating film 41 and the second conductive plug 54 to a thickness of approximately 100 nm. This silicon oxynitride film is used as an anti-oxidation insulating film 55.

Next, as shown in FIG. 6N, the first and second capacitor protection insulating films 39 and 40, the second interlayer insulating film 41, and the anti-oxidation insulating film 55 are patterned, and thereby second holes 41d are formed in these films on the upper electrodes 25a.

After these second holes 41d are formed, in order to recover damage suffered by the capacitor dielectric films 24a in the steps described so far, annealing may be performed in an oxygen-containing atmosphere. Even if annealing is thus performed, the oxidation of the second conductive plug 54 is prevented by the anti-oxidation insulating film 55.

Thereafter, the anti-oxidation insulating film 55 is etched back to be removed.

Subsequently, as shown in FIG. 6O, a metal film stack is formed on the respective upper surfaces of the second interlayer insulating film 41 and the second conductive plug 54 by sputtering, and this metal film stack is patterned to form metal interconnections 57a and a conductive pad 57b for the bit line.

The metal film stack is made by, for example, forming a titanium film having a thickness of 60 nm, a titanium nitride film having a thickness of 30 nm, a copper-containing aluminum film having a thickness of 400 nm, a titanium film having a thickness of 5 nm, and a titanium nitride film having a thickness of 70 nm in this order.

By the above-described steps, the basic structure of the semiconductor device according to this embodiment is completed.

In this embodiment described above, the third conductive plugs 36a and the underlying insulating film 15 of the first embodiment are not formed. Accordingly, the process can be simplified compared with that of the first embodiment.

Furthermore, the second conductive plug 54 constituting part of the bit line over the second source/drain region 8b includes only a single layer. Accordingly, a simpler structure is obtained, which is simpler than that in the first embodiment in which two layers of conductive plugs 32b and 47b are formed.

Also, as in the first embodiment, a two-layer structure including the lower conductive layer 23b made of platinum and the upper conductive layer 23c made of iridium is employed as the layer structures of the lower electrodes 23a to reduce the proportion of iridium in the lower electrodes 23a. Accordingly, in the step of forming the capacitors Q by simultaneous etching (FIG. 6H), it is possible to reduce the number of iridium grains scattered from the side surfaces of the lower electrodes 23a into the etching atmosphere, and to prevent leakage paths from being formed by the iridium grains.

(6) Fifth Embodiment

Figure 7A:
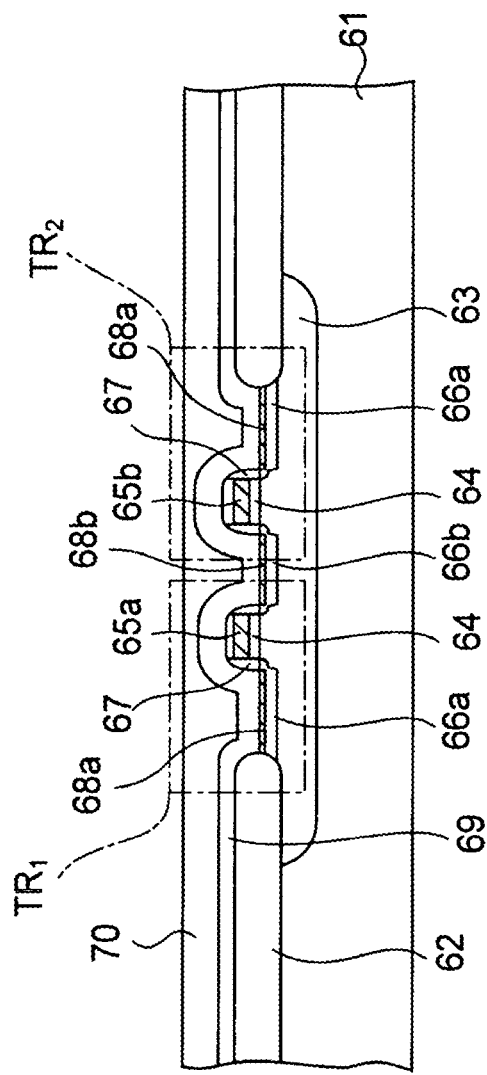
FIGS. 7A to 7N are cross-sectional views of a semiconductor device according to a fifth embodiment of the present invention in the process of being manufactured.
Figure 7D:
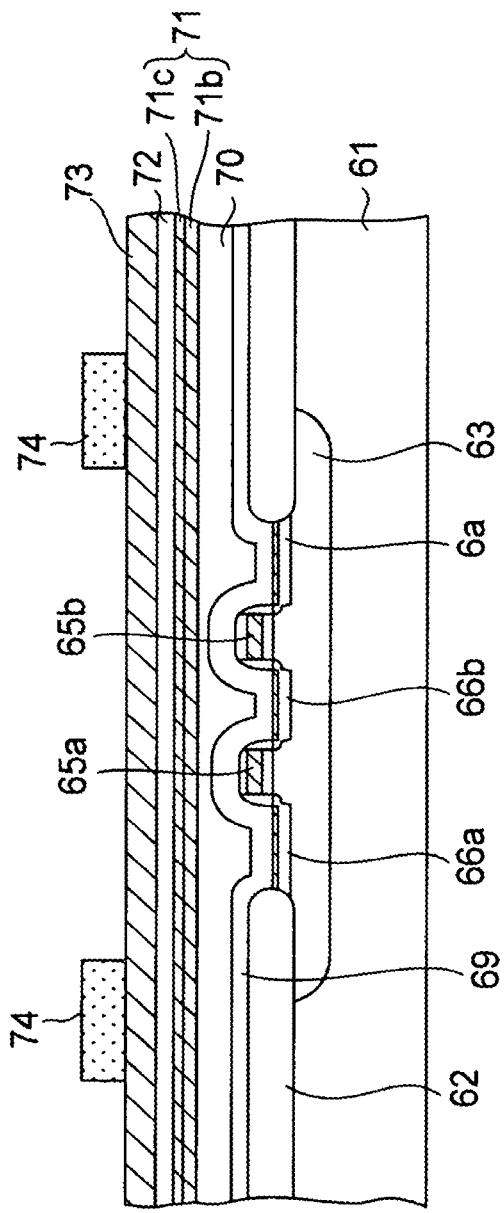
Figure 7E:
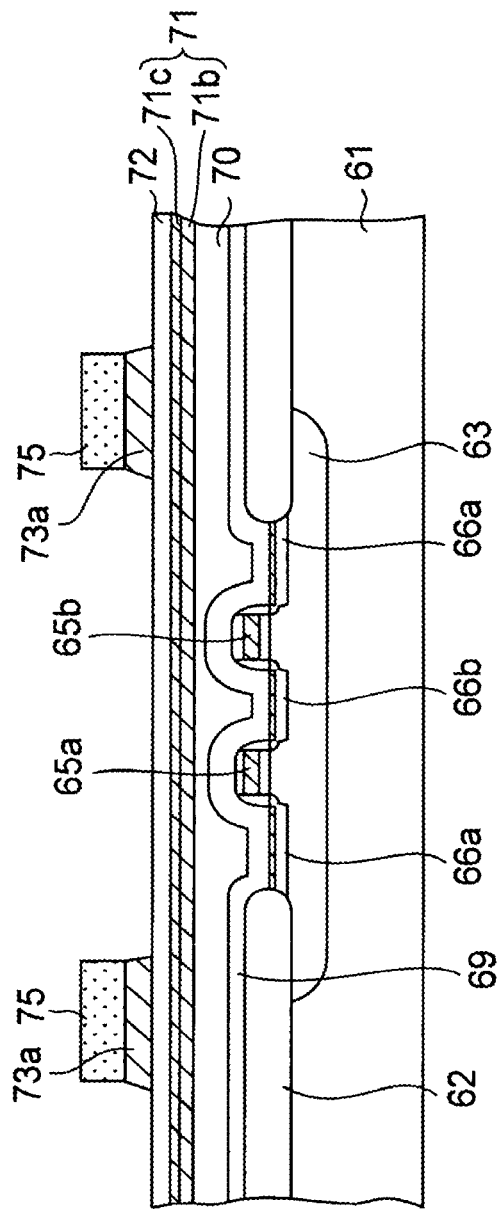
Figure 7H:
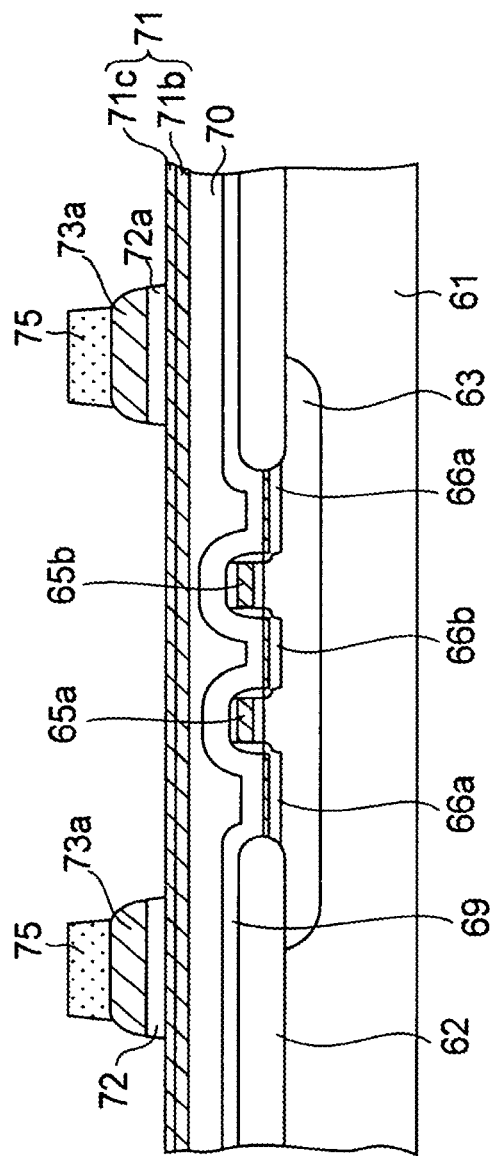
Figure 7I:
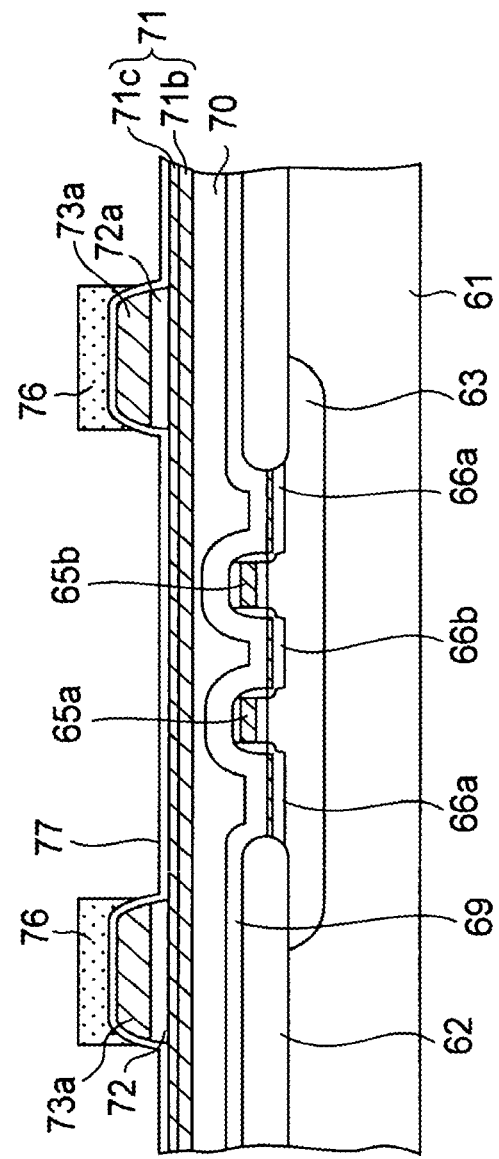
Figure 7N:
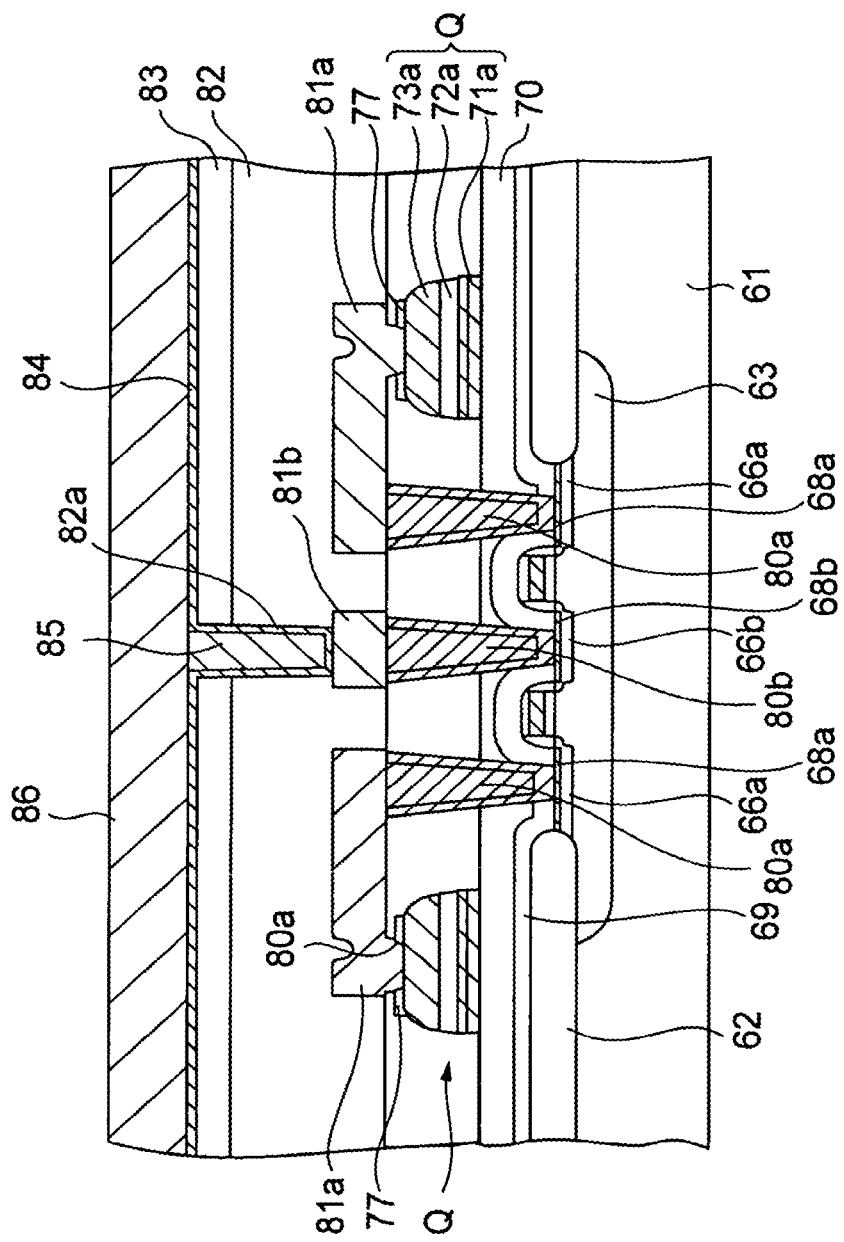

FIGS. 7A to 7N are cross-sectional views of a semiconductor device according to this embodiment in the process of being manufactured. FIGS. 8A to 8J are plan views thereof.

In this embodiment, a description on a planar FeRAM will be given.

First, steps for obtaining the cross-sectional structure shown in FIG. 7A will be described. In a surface of an n- or p-type silicon substrate 61, an element isolation insulating film 26 is formed by local oxidation of silicon (LOCOS). For forming the element isolation insulating film 62, shallow trench isolation (STI) may be also employed. After such an element isolation insulating film 62 is formed, a p-well 63 is formed in a predetermined active area in a memory cell region of the silicon substrate 61.

Thereafter, the surface of the active area of the silicon substrate 61 is thermally oxidized to form a silicon oxide film. This silicon oxide film is used as gate insulating films 64. Next, a conductive film made of polycrystalline silicon or refractory metal silicide is formed over the entire upper surface of the silicon substrate 61. Then, the conductive film is patterned into predetermined shapes by photolithography, and thus gate electrodes 65a and 65b are formed. On one p-well 63 in the memory cell region, two gate electrodes 65a and 65b are arranged approximately in parallel. These gate electrodes 65a and 65b constitute portions of word lines.

Subsequently, ions of an n-type impurity are implanted into the p-well 63 on both sides of the gate electrodes 65a and 65b, and thus n-type impurity diffusion regions 66a and 66b are formed, which respectively become sources and drains of re-channel MOS transistors. Furthermore, an insulating film is formed over the entire surface of the silicon substrate 61, and then the insulating film is etched back to be left as insulating sidewalls 67 on both side surfaces of the gate electrodes 65a and 65b. The insulating film is, for example, silicon oxide formed by CVD.

Furthermore, using the gate electrodes 65a and 65b and the insulating sidewalls 67 as a mask, ions of an n-type impurity are again implanted into the p-well 63, whereby the n-type impurity diffusion regions 66a and 66b have lightly doped drain (LDD) structures. It should be noted that, in one p-well 63, the n-type impurity diffusion region 66b sandwiched between the two gate electrodes 65a and 65b is electrically connected to a bit line described later, and the two impurity diffusion regions 66a near both ends of the p-well 63 are electrically connected to capacitor upper electrodes described later.

Figure 8A:
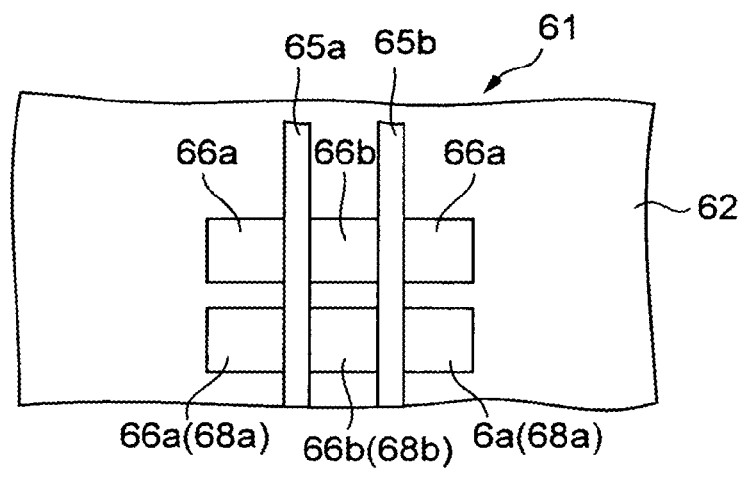
FIGS. 8A to 8J are plan views of the semiconductor device according to the fifth embodiment of the present invention in the process of being manufactured.

As described above, in the p-well 63 of the memory cell region, the gate electrodes 65a and 65b, the n-type impurity diffusion regions 66a and 66b, and the like constitute two n-type MOS transistors $TR_1$ and $TR_2$, and the planar structure of a memory cell such as shown in FIG. 8A is obtained. It should be noted, however, that the insulating sidewalls 67 are omitted in the plan view. Next, a refractory metal film is formed over the entire surface. Then, this refractory metal film is heated to form refractory metal silicide layers 68a and 68b respectively on the surfaces of the n-type impurity diffusion regions 66a and 66b. Thereafter, unreacted portions of the refractory metal film are removed by wet etching.

Additionally, a silicon oxynitride film is formed as a cover insulating film 69 over the entire surface of the silicon substrate 61 to a thickness of approximately 200 nm by plasma CVD. Moreover, a silicon oxide film is grown as a first interlayer insulating film 70 on the cover insulating film 69 to a thickness of approximately 1.0 μm by plasma CVD using TEOS gas. Subsequently, the first interlayer insulating film 70 is polished by CMP to planarize the upper surface thereof.

Next, steps for obtaining the cross-sectional structure shown in FIG. 7B will be described.

First, a platinum film is formed on the first interlayer insulating film 70 to a thickness of approximately 100 nm by sputtering. This platinum film is used as a lower conductive layer 71b of a first conductive film.

Furthermore, an iridium film is formed as a second conductive layer 71c on the lower conductive layer 71b to a thickness of approximately 75 nm by sputtering.

Accordingly, the lower and upper conductive layers 71*b* and 71*c* formed as described above constitute a first conductive film 71 as shown in FIG. 7B.

It should be noted that, in order to improve the adhesion between the first conductive film 71 and the first interlayer insulating film 70, any one of a titanium film, an alumina film, an aluminum nitride film, a titanium aluminum nitride film, a tantalum oxide film, a titanium oxide film, and a zirconium oxide film may be formed therebetween as an adhesive film.

Next, as shown in FIG. 7C, a PZT film is formed on the first conductive film 71 to a thickness of 100 to 300 nm by MOCVD. This PZT film is used as a ferroelectric film 72.

Methods of forming the ferroelectric film 72 include the spin-on method, the sol-gel method, and metal organic deposition (MOD), other than the above-described MOCVD. A material for the ferroelectric film 72 may be PLZT, a bismuth layered compound, or the like, other than PZT.

After such a ferroelectric film 72 is formed, an iridium oxide film is formed thereon as a second conductive film 73 to a thickness of 150 to 250 nm by sputtering.

It should be noted that, in order to improve electric characteristics of capacitors, a film stack including a conductive metal oxide film and a conductivity-improving film may be formed as the second conductive film 73 as in the first embodiment.

Figure 8B:
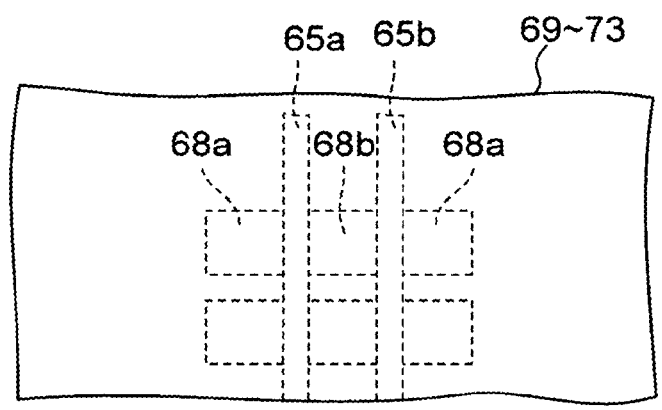

The memory cell in a state in which this second conductive film 73 is formed has the planar structure shown in FIG. 8B.

Subsequently, as shown in FIG. 7D, resist is applied over the second conductive film 73 to be exposed and developed. Accordingly, a first resist pattern 74 having the shapes of upper electrodes is formed.

Figure 8C:
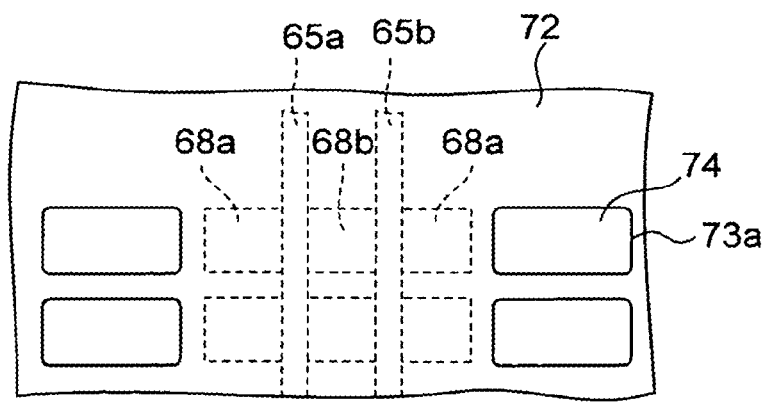

Next, as shown in FIGS. 7E and 8C, the second conductive film 73 is etched using the first resist pattern 74 as a mask, and then, the remaining portions of the second conductive film 73 are used as upper electrodes 73*a* of the capacitors.

Subsequently, as shown in FIG. 7F, the first resist pattern 74 is removed to expose the capacitor upper electrodes 73*a*. Thereafter, the ferroelectric film 72 is annealed in an oxygen atmosphere through the capacitor upper electrodes 73*a* under the following conditions: a temperature of 650° C. and an annealing time of 60 minutes. This annealing is performed in order to recover damage suffered by the ferroelectric film 72 during sputtering and etching.

Figure 8D:
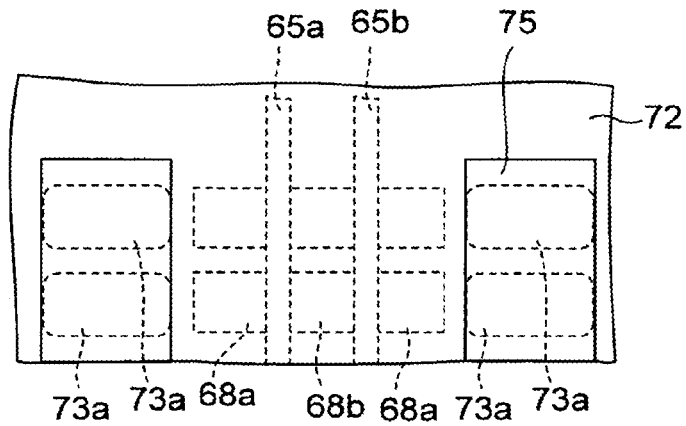

Next, resist is applied over the upper electrodes 73*a* and the ferroelectric film 72 to be exposed and developed, and thus a second resist pattern 75 is formed as shown in FIGS. 7G and 8D. The second resist pattern 75 has a striped shape. Each stripe in the shape passes over a plurality of upper electrodes 73*a* arranged in line in a direction in which the gate electrodes 65*a* and 65*b* extend, and also has a width equivalent to that of each of the upper electrodes 73*a*.

Figure 8E:
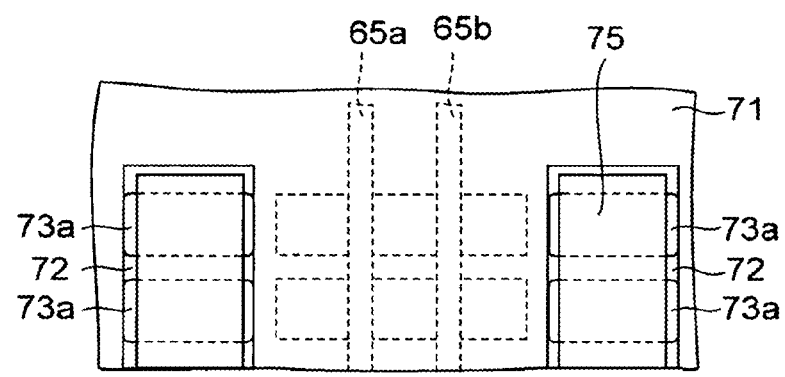

Thereafter, as shown in FIGS. 7H and 8E, the ferroelectric film 72 is etched using the second resist pattern 75 as a mask. At this time, etching conditions are set so that the second resist pattern 75 can be appropriately set back, whereby by-products are prevented from adhering to sidewalls of the capacitors. The setback amount of the resist is controlled by adding gas reactive with the resist, e.g., chlorine gas, to process gas, or adjusting pressure or bias power.

During the etching of the ferroelectric film 72, the second resist pattern 75 is set back, portions near both side edges of the upper electrodes 73*a* are exposed, and upper portions of both of the side edges are etched. The exposed portions function as a mask for the ferroelectric film 72, and, at the point in time when the etching of the ferroelectric film 72 is finished, both sides of each of the upper electrodes 73*a* are also left to have thicknesses sufficiently appropriate to the mask properties.

Figure 8F:
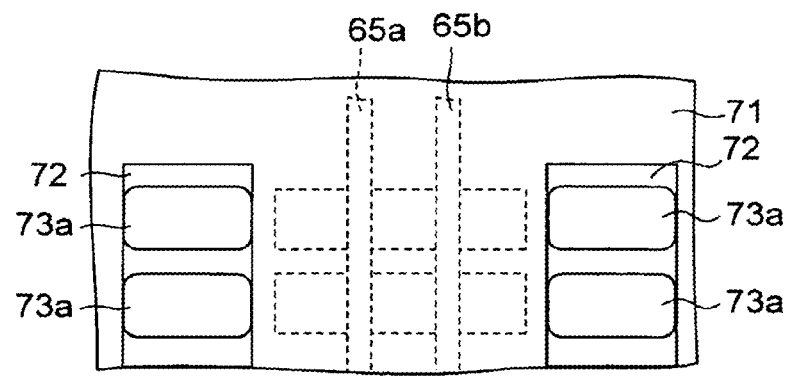

The ferroelectric film 72 patterned into a striped shape using the upper electrodes 73*a* as part of a mask as described above is used as capacitor dielectric films 72*a*. Then, after the second resist pattern 75 is removed, the capacitor dielectric films 72*a* are annealed in an oxygen atmosphere at a temperature of 650° C. for 60 minutes. The planar state after the second resist pattern 75 is removed becomes as shown in FIG. 8F.

Figure 8G:
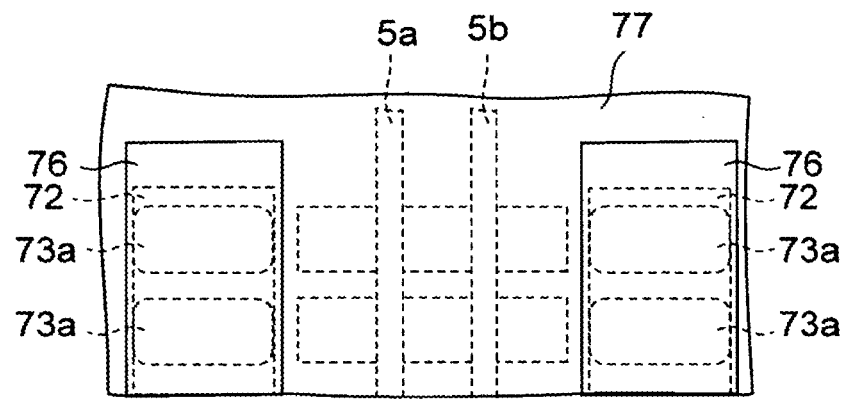

Next, as shown in FIGS. 7I and 8G, an alumina film is formed as a capacitor protection insulating film 77 on the upper electrodes 73*a*, the capacitor dielectric films 72*a*, and the first conductive film 71 to a thickness of 50 nm by sputtering at room temperature. This capacitor protection insulating film 77 is formed in order to protect the capacitor dielectric films 72*a* prone to reduction from hydrogen. As the capacitor protection insulating film 77, a PZT film, a PLZT film, or a titanium oxide film may be formed. It should be noted that the capacitor protection insulating film 77 is omitted in FIG. 8G.

Thereafter, the capacitor dielectric films 72*a* under the capacitor protection insulating film 77 is subjected to rapid heat treatment in an oxygen atmosphere under the following conditions: 700° C., 60 seconds, and a temperature rise rate of 125° C./sec. By this way, the quality of the capacitor dielectric films 72*a* is improved. Next, resist is applied over the capacitor protection insulating film 77 to be exposed and developed, whereby a third resist pattern 76 having a striped shape in which each stripe is longer than the capacitor dielectric films 72*a* and has a width equivalent to that of each of the upper electrodes 73*a* is formed along and over the capacitor dielectric films 72*a*.

Figure 8H:
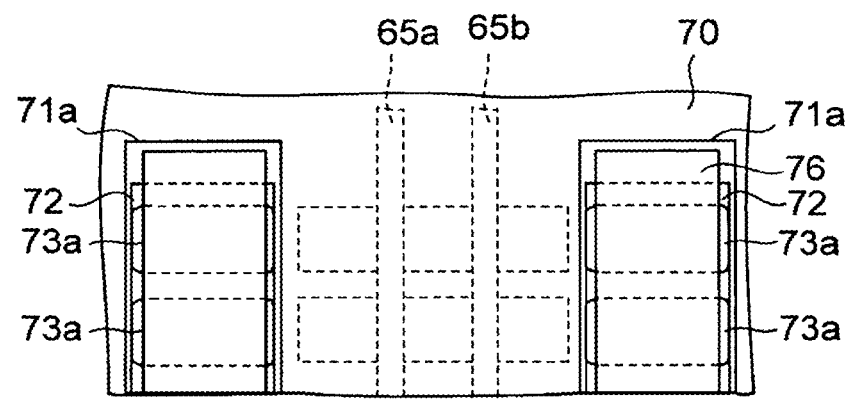

Thereafter, as shown in FIGS. 7J and 8H, the first conductive film 71 and the capacitor protection insulating film 77 are dry-etched using the third resist pattern 76 as a mask. The striped first conductive film 71 left under the third resist pattern 76 is thus used as lower electrodes 71*a*. In a planar FeRAM, the lower electrodes 71*a* are also referred to as plate lines.

In the dry etching, a gas mixture of chlorine gas and argon gas is used as etching gas. Side surfaces of the third resist pattern 76 are appropriately set back due to damage from the etching gas converted into a plasma.

Thus, during the etching of the first conductive film 71 and the capacitor protection insulating film 77, upper portions near both side edges of the upper electrodes 73*a* are exposed to be etched. The exposed portions function as a mask, and, at the point in time when the etching of the first conductive film 71 is finished, the upper electrodes 73*a* are left to have thicknesses sufficiently appropriate to mask properties, e.g., thicknesses of 20 nm.

Here, during the etching of the first conductive film 71, iridium grains are scattered into the etching atmosphere from the upper conductive layer 71*c*, which partially constitutes the first conductive film 71, and which is made of iridium. It should be noted, however, that in this embodiment, since each of the lower electrodes 71*a* has a two-layer structure including the lower and upper conductive layers 71*b* and 71*c* to reduce the proportion of iridium in the lower electrodes 71*a* as in the first to fourth embodiments. Accordingly, the amount of the above-described scattered iridium grains can be reduced compared with that in a case where the entire lower electrodes 71*a* are formed of iridium. As a result, leakage paths can be prevented from being formed between the lower and upper electrodes 71a and 73a by iridium grains again adhering to the side surfaces of the capacitor dielectric films 72a.

The planar structure after this step is finished becomes as shown in FIG. 8H. A plurality of upper electrodes 73a are formed on one capacitor dielectric film 72a having the shape of a striped shape, and the lower electrode 71a under the capacitor dielectric film 72a is longer than the capacitor dielectric film 72a. Accordingly, on the first interlayer insulating film 70, capacitors Q each including the lower electrode 71a, the capacitor dielectric film 72a, and the capacitor upper electrode 73a are formed as many as the capacitor upper electrodes 73a.

Then, after the third resist pattern 76 is removed, the capacitor dielectric films 72a are annealed in an oxygen atmosphere under the following conditions: a temperature of 650° C. and an annealing time of 60 minutes. By this annealing, the capacitor dielectric films 72a are caused to recover from damage.

Next, as shown in FIG. 7K, a silicon oxide film having a thickness of 1200 nm is formed as a second interlayer insulating film 78 on the capacitors Q and the first interlayer insulating film 70 by CVD. Then, the surface of the second interlayer insulating film 78 is planarized by CMP. The growth of the second interlayer insulating film 78 may be performed using silane or TEOS gas as reaction gas. The surface of the second interlayer insulating film 78 is planarized until the thickness thereof becomes 200 nm from the upper surfaces of the capacitor upper electrodes 73a.

Figure 8I:
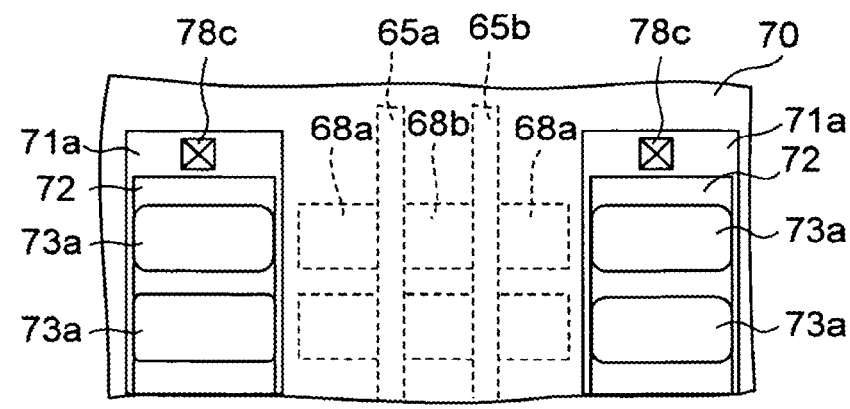

Next, steps for forming the structure shown in FIGS. 7L and 8I will be described. First, the first and second interlayer insulating films 70 and 78 and the cover insulating film 69 are patterned, and thus contact holes 78a, 78b and 78c are formed over the n-type impurity diffusion regions 66a and 66b and the lower electrodes 71a. As etching gas for the first and second interlayer insulating films 70 and 78 and the cover insulating film 69, CF-based gas, e.g., a gas mixture made by adding Ar to $CF_4$ gas, is used. It should be noted that the contact holes 78c formed on the lower electrodes 71a are not shown in the cross-sectional view but represented by forming positions in FIG. 8I.

Next, a titanium film having a thickness of 20 nm and a titanium nitride film having a thickness of 50 nm are formed on the upper surface of the second interlayer insulating film 75 and the inner surfaces of the contact holes 78a, 78b, and 78c by sputtering. These films are used as a glue film. Furthermore, a tungsten film is formed on this glue film by CVD, whereby the contact holes 78a, 78b and 78c are fully filled with the tungsten film.

Furthermore, the tungsten film and the glue film on the second interlayer insulating film 75 are removed by CMP to leave these films only in the contact holes 78a, 78b, and 78c. The tungsten film and the glue film in the contact holes 78a, 78b and 78c are thus used as conductive plugs 79a and 79b. It should be noted that in one p-well 73 of the memory cell region, the first conductive plug 79b over the center n-type impurity diffusion region 66b sandwiched between the two gate electrodes 65a and 65b is electrically connected to a bit line described later, and the two second conductive plugs 78a on both sides of the first conductive plug 79b are electrically connected respectively to the upper electrodes 73a through interconnections described later.

Figure 8J:
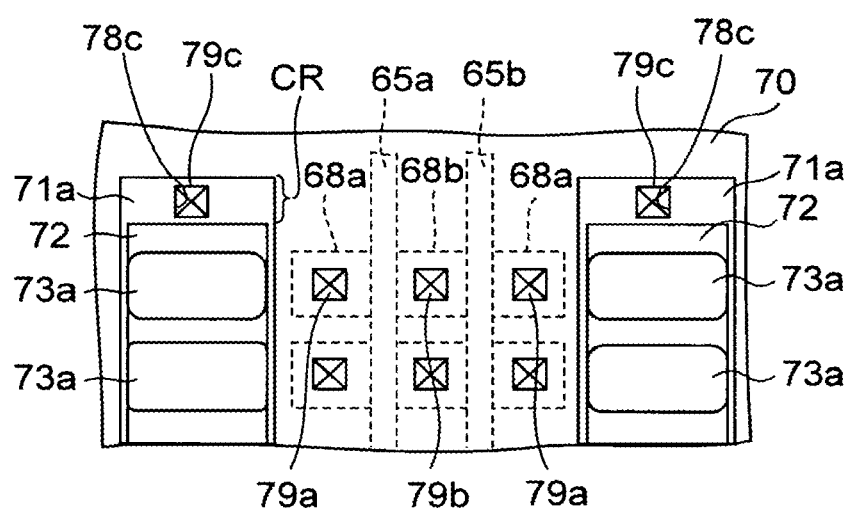

FIG. 8J is a plan view after this step is finished.

In this step, as shown in FIG. 8J, third conductive plugs 79c electrically connected respectively to the lower electrodes 71a are formed in the corresponding contact holes 78c formed in regions (contact regions CR) of the lower electrodes 71a in which the lower electrodes 71a protrude from edges of the capacitor dielectric films 72a.

Thereafter, the second interlayer insulating film 78 is heated in a vacuum chamber at a temperature of 390° C. to expel moisture to the outside.

Next, steps for obtaining the cross-sectional structure shown in FIG. 7M will be described.

First, a silicon oxynitride film is formed as an anti-oxidation insulating film 80 on the second interlayer insulating film 78 and the conductive plugs 79a and 79b to a thickness of, for example, 100 nm by plasma CVD. This silicon oxynitride film is formed using a gas mixture of silane and $N_2O$.

Subsequently, the capacitor protection insulating film 77, the second interlayer insulating film 78, and the anti-oxidation insulating film 80 are patterned by photolithography, and thus holes 80a on the upper electrodes 73a are formed. Thereafter, the capacitor dielectric films 72a are annealed in an oxygen atmosphere under the following conditions: 550° C. and 60 minutes. Accordingly, the quality of the capacitor dielectric films 72a is improved. In this case, the oxidation of the conductive plugs 79a and 79b is prevented by the anti-oxidation insulating film 80.

Next, steps for forming the structure shown in FIG. 7N will be described. First, the anti-oxidation insulating film 80 is removed by dry etching using CF-based gas. Then, the respective surfaces of the conductive plugs 79a and 79b and the upper electrodes 73a are etched to a depth of approximately 10 nm by RF etching to expose clean surfaces. Thereafter, a four-layer conductive film containing aluminum is formed on the second interlayer insulating film 78, the conductive plugs 79a and 79b, and the holes 80a by sputtering. The conductive film includes a titanium nitride film having a thickness of 50 nm, a copper-containing aluminum film having a thickness of 500 nm, a titanium film having a thickness of 5 nm, and a titanium nitride film having a thickness of 100 nm in this order from bottom to top.

Then, the multilayer conductive film is patterned by photolithography to form a via contact pad 81b on the conductive plug 79b in the center of the p-well 63, and to form metal interconnections 81a having shapes which connect the upper surfaces of the conductive plugs 79a respectively on both sides of the conductive plug 79b to the upper surfaces of the upper electrodes 73a. Accordingly, the upper electrodes 73a are connected respectively to the n-type impurity diffusion regions 66a near both ends of the p-well 63 through the metal interconnections 81a, the conductive plugs 79a, and the refractory metal silicide layers 68a. It should be noted that other interconnections (not shown) are also formed on conductive plugs (not shown) formed in the contact holes 78c (see FIG. 8I) on the lower electrodes 71a.

Subsequently, a silicon oxide film is formed as a third interlayer insulating film 82 to a thickness of 2300 nm by plasma CVD using TEOS gas, whereby the second interlayer insulating film 78, the metal interconnections 81a, the contact pad 81b, and the like are covered with the third interlayer insulating film 82. Then, the surface of the third interlayer insulating film 82 is planarized by CMP. Furthermore, a protection insulating film 83 made of silicon oxide is formed on the third interlayer insulating film 82 by plasma CVD using TEOS gas. Thereafter, the third interlayer insulating film 82 and the protection insulating film 83 are patterned, thus forming a hole 82a on the contact pad 81b over the center of the p-well 63 of the memory cell region.

Next, a glue film 84, which is made of titanium nitride, and which has a thickness of 90 nm to 150 nm, is formed on the upper surface of the protection insulating film 83 and the inner surface of the hole 82a by sputtering, and a tungsten film 85 is then formed by CVD to fill the hole 82a. Subsequently, this tungsten film 85 is etched back to be left only in the hole 82a. The tungsten film 85 left in the hole 82a is used as a second-layer conductive plug.

Thereafter, a metal film is formed on the glue film 84 and the tungsten film 85 by sputtering. Then, the metal film is patterned by photolithography, thus forming a bit line 86 electrically connected to the n-type impurity diffusion region 66b through the second-layer conductive plug, the contact pad 81b, the first-layer conductive plug 80b, and the refractory metal silicide layer 68b.

By the above-described steps, the basic structure of the semiconductor device according to this embodiment is completed.

In this embodiment, the second and third resist patterns 76 and 77 are set back from the side thereof during the etching of the ferroelectric film 72 or the first conductive film 71. Accordingly, both shoulder portions of the upper electrodes 73a are exposed to be partially etched. Since the exposed portions function as an etching mask for the ferroelectric film 72 and the first conductive film 71, the patterning of the ferroelectric film 72 and the first conductive film 71 are favorably performed. Thus, side surfaces of the upper electrodes 73a, the side surfaces of the capacitor dielectric films 72a, and the side surfaces of the lower electrodes are approximately in the same plane.

Furthermore, as the layer structure of the first conductive film 71, a two-layer structure is employed which includes the lower conductive layer 71b made of platinum and the upper conductive layer 71c made of iridium. Accordingly, the proportion of iridium in the first conductive film 71 is reduced. As a result, in the step of forming the lower electrodes 71a by etching (FIG. 7J), the number of iridium grains scattered from the side surfaces of the lower electrodes 71a into the etching atmosphere is reduced. Accordingly, leakage paths can be prevented from being formed on the side surfaces of the capacitor dielectric films 72a by iridium grains, and the leakage currents of the capacitors Q can be reduced.

As described above, according to the present invention, by giving a two-layer structure including lower and upper conductive layers to a first conductive film, which becomes a lower electrode of a capacitor, the proportion of a material for the upper conductive layer in the first conductive film is reduced. Accordingly, it is possible to prevent the material for the upper conductive layer from being scattered as grains during the patterning of the lower electrodes, and the leakage current of the capacitor can be prevented from being increased by the grains of the material again adhering to side surfaces of capacitor dielectric films.

What is claimed is:
1. A method of manufacturing a semiconductor device, comprising the steps of:
  forming a first interlayer insulating film over a semiconductor substrate;
  forming a first conductive film over the first interlayer insulating film;
  forming a ferroelectric film on the first conductive film;
  forming a second conductive film on the ferroelectric film;
  forming an upper electrode of a capacitor by patterning the second conductive film;
  forming a capacitor dielectric film by patterning the ferroelectric film; and
  forming a lower electrode of the capacitor by patterning the first conductive film, wherein the step of forming the first conductive film comprises the steps of:
    forming a lower conductive layer made of a noble metal other than iridium over the first interlayer insulating film; and
    forming an upper conductive layer on the lower conductive layer, the upper conductive layer being made of a conductive material, which is different from a material for the lower conductive layer, and which is other than platinum; and
  further comprising the steps of:
    forming a first impurity diffusion region and a second impurity diffusion region in the semiconductor substrate;
    forming a first hole in the first interlayer insulating film over the first impurity diffusion region; and
    forming a first conductive plug in the first hole,
    wherein, in the step of forming the lower electrode, the lower electrode is formed over the first conductive plug, and the lower electrode and the first conductive plug are electrically connected to each other;
    forming an underlying insulating film on the first interlayer insulating film and the first conductive plug;
    forming a second hole in the underlying insulating film on the first conductive plug;
    forming a second conductive plug in the second hole, the second conductive plug being electrically connected to the first conductive plug;
    forming a crystalline conductive film on the underlying insulating film and the second conductive plug; and
    forming a conductive oxygen barrier film on the crystalline conductive film,
    wherein, in the step of forming the first conductive film, the first conductive film is formed on the conductive oxygen barrier film.

2. The method according to claim 1, wherein
in the step of forming the lower conductive layer, the lower conductive layer is formed thicker than the upper conductive layer.

3. The method according to claim 1, wherein
in the step of forming the lower conductive layer, a platinum film is formed as the lower conductive layer by sputtering at a substrate temperature of not less than 250° C. nor more than 450° C., and
in the step of forming the upper conductive layer, an iridium film is formed as the upper conductive layer by sputtering at a substrate temperature of not less than 400° C. nor more than 550° C.

4. The method according to claim 1, wherein
after the upper conductive layer is formed, the first conductive film is annealed in an inert gas atmosphere.

5. The method according to claim 1, wherein
any one of platinum, rhodium and palladium is employed as the noble metal constituting the lower conductive layer.

6. The method according to claim 1, wherein
any one of iridium, ruthenium, iridium oxide, ruthenium oxide and $SrRuO_3$ is employed as the conductive material constituting the upper conductive layer.

7. The method according to claim 1, further comprising the steps of:
  after forming the second conductive plug, forming a planarization conductive film on the second conductive plug and the underlying insulating film; and
  planarizing the planarization conductive film,
  wherein, in the step of forming the crystalline conductive film, the crystalline conductive film is formed on the planarization conductive film.

8. The method according to claim 1, further comprising the steps of:
   forming a third hole in the first interlayer insulating film over the second impurity diffusion region;
   forming a third conductive plug in the third hole;
   before forming the underlying insulating film, forming an anti-oxidation insulating film, in which the second hole is to be formed, on the first interlayer insulating film, the first conductive plug and the third conductive plug;
   after forming the capacitor, forming a second interlayer insulating film covering the capacitor;
   forming a fourth hole in the anti-oxidation insulating film, the underlying insulating film, and the second interlayer insulating film on the third hole; and
   forming a fourth conductive plug in the fourth hole, the fourth conductive plug being electrically connected to the third conductive plug.

9. The method according to claim 1, wherein
   in the step of forming the capacitor dielectric film and the step of forming the lower electrode, the ferroelectric film and the first conductive film are etched using the same mask, and thereby portions of the ferroelectric film and the first conductive film, which are left without being etched in regions not covered with the mask, are formed into the capacitor dielectric film and the lower electrode, respectively.

* * * * *